US008623469B2

(12) United States Patent
Shimomura et al.

(10) Patent No.: US 8,623,469 B2
(45) Date of Patent: Jan. 7, 2014

(54) METHOD OF HEATING DISPERSION COMPOSITION AND METHOD OF FORMING GLASS PATTERN

(71) Applicant: Semiconductor Energy Laboratory Co., Ltd., Kanagawa-ken (JP)

(72) Inventors: Akihisa Shimomura, Kanagawa (JP); Hidekazu Miyairi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/656,059

(22) Filed: Oct. 19, 2012

(65) Prior Publication Data

US 2013/0101754 A1    Apr. 25, 2013

(30) Foreign Application Priority Data

Oct. 21, 2011    (JP) .................... 2011-232096

(51) Int. Cl.
*B05D 3/00* (2006.01)
*B23K 26/00* (2006.01)

(52) U.S. Cl.
USPC .................. 427/554; 427/555; 219/121.6

(58) Field of Classification Search
None
See application file for complete search history.

(56) References Cited

U.S. PATENT DOCUMENTS

| 6,113,450 | A  | 9/2000  | Narayanan et al. |
| 6,596,613 | B1 | 7/2003  | Kusumoto et al.  |
| 6,646,284 | B2 | 11/2003 | Yamazaki et al.  |
| 6,803,246 | B2 | 10/2004 | Yamazaki et al.  |
| 6,860,780 | B2 | 3/2005  | Miyashita et al. |
| 6,903,800 | B2 | 6/2005  | Onishi et al.    |
| 6,984,159 | B1 | 1/2006  | Kado et al.      |
| 6,998,776 | B2 | 2/2006  | Aitken et al.    |
| 7,121,642 | B2 | 10/2006 | Stoessel et al.  |
| 7,407,423 | B2 | 8/2008  | Aitken et al.    |
| 7,431,628 | B2 | 10/2008 | Park et al.      |
| 7,564,185 | B2 | 7/2009  | Song et al.      |
| 7,602,121 | B2 | 10/2009 | Aitken et al.    |
| 7,701,136 | B2 | 4/2010  | Kwak             |
| 7,780,493 | B2 | 8/2010  | Choi et al.      |
| 7,837,530 | B2 | 11/2010 | Park             |
| 7,862,396 | B2 | 1/2011  | Lee              |
| 7,868,540 | B2 | 1/2011  | Kim              |
| 7,871,949 | B2 | 1/2011  | Lee et al.       |
| 7,944,143 | B2 | 5/2011  | Choi et al.      |
| 8,063,560 | B2 | 11/2011 | Aitken et al.    |

(Continued)

FOREIGN PATENT DOCUMENTS

| JP | 5-208852  | 8/1993  |
| JP | 11-329717 | 11/1999 |

(Continued)

*Primary Examiner* — Kelly M Gambetta
*Assistant Examiner* — Ina Agaj
(74) *Attorney, Agent, or Firm* — Husch Blackwell LLP

(57) ABSTRACT

Provided are a method of heating a composition which is applicable to a substrate provided with a material having low heat resistance and a method of forming a glass pattern which leads to reduction of cracks. A composition formed over a substrate is irradiated with a laser beam to bake the paste through local heating. Scan with the laser beam is performed so that there can be no difference in the laser beam irradiation period between the middle portion and the perimeter portion of the composition. Specifically, irradiation with the laser beam is performed so that the width of the beam spot overlapping with the composition in the scanning direction is substantially uniform.

8 Claims, 17 Drawing Sheets

(56) References Cited

U.S. PATENT DOCUMENTS

| | | |
|---|---|---|
| 8,125,146 B2 | 2/2012 | Park |
| 8,142,251 B2 | 3/2012 | Lee et al. |
| 8,164,257 B2 | 4/2012 | Choi et al. |
| 8,226,448 B2 | 7/2012 | Voronov et al. |
| 2004/0195222 A1 | 10/2004 | Tanaka et al. |
| 2004/0207314 A1 | 10/2004 | Aitken et al. |
| 2007/0128967 A1* | 6/2007 | Becken et al. .................. 445/25 |
| 2007/0170854 A1 | 7/2007 | Kwak |
| 2007/0200835 A1 | 8/2007 | Choo et al. |
| 2008/0182062 A1* | 7/2008 | Becken et al. .................. 428/68 |
| 2009/0086325 A1* | 4/2009 | Liu et al. ....................... 359/599 |
| 2009/0117716 A1 | 5/2009 | Shimomura et al. |
| 2010/0078646 A1 | 4/2010 | Sumita et al. |
| 2010/0096984 A1 | 4/2010 | Kim |
| 2010/0129666 A1* | 5/2010 | Logunov et al. .............. 428/426 |
| 2011/0135857 A1* | 6/2011 | Logunov et al. ............. 428/34.6 |
| 2012/0264346 A1 | 10/2012 | Shimomura et al. |
| 2012/0318023 A1 | 12/2012 | Shimomura |
| 2012/0319092 A1 | 12/2012 | Shimomura |
| 2013/0048967 A1 | 2/2013 | Nishido et al. |
| 2013/0095582 A1 | 4/2013 | Miyairi et al. |

FOREIGN PATENT DOCUMENTS

| | | |
|---|---|---|
| JP | 2003-297558 | 10/2003 |
| JP | 2011-54477 | 3/2011 |
| JP | 2011-65895 | 3/2011 |
| JP | 2011-70797 | 4/2011 |

* cited by examiner

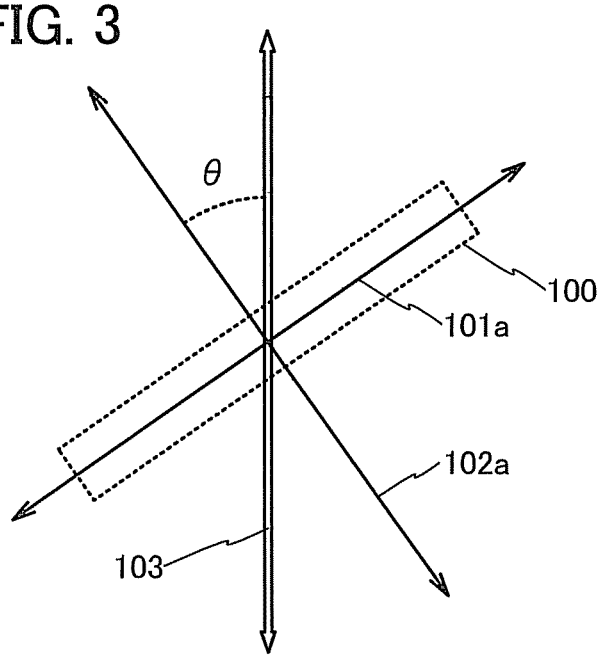

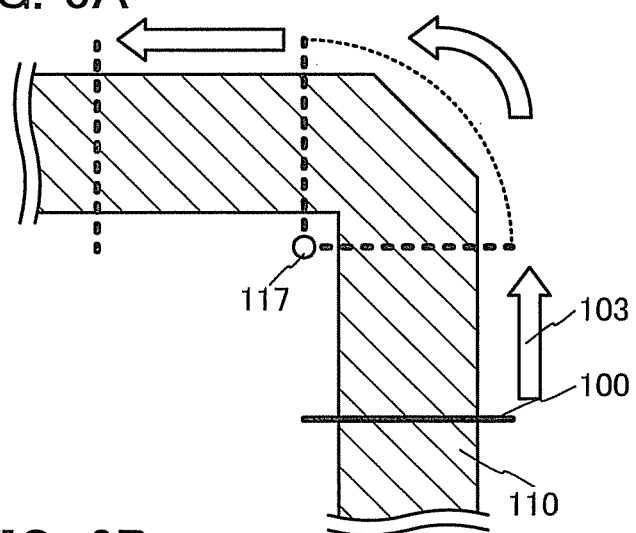
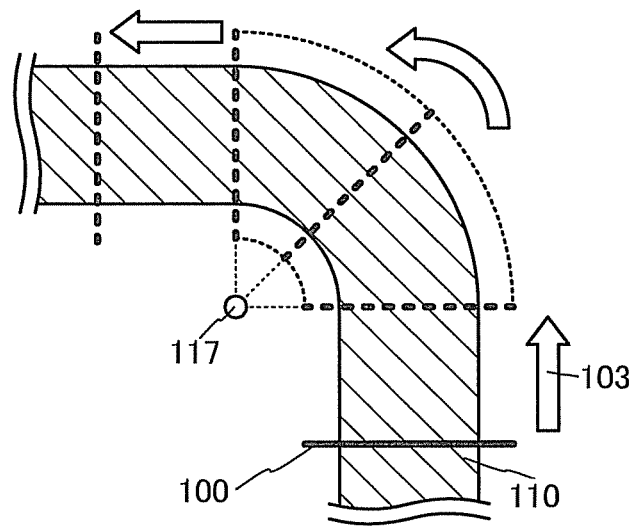

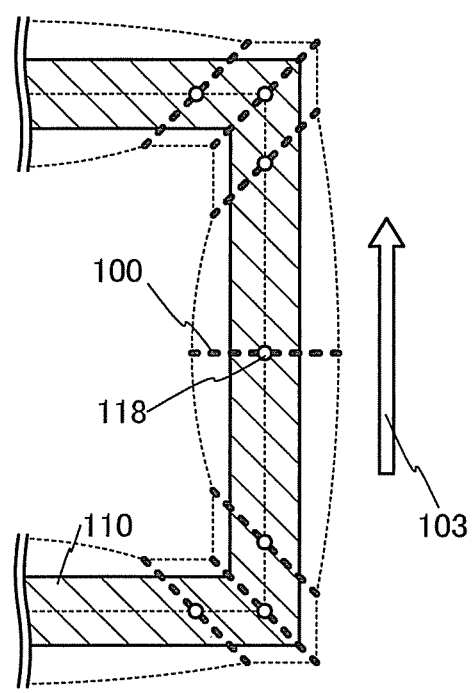

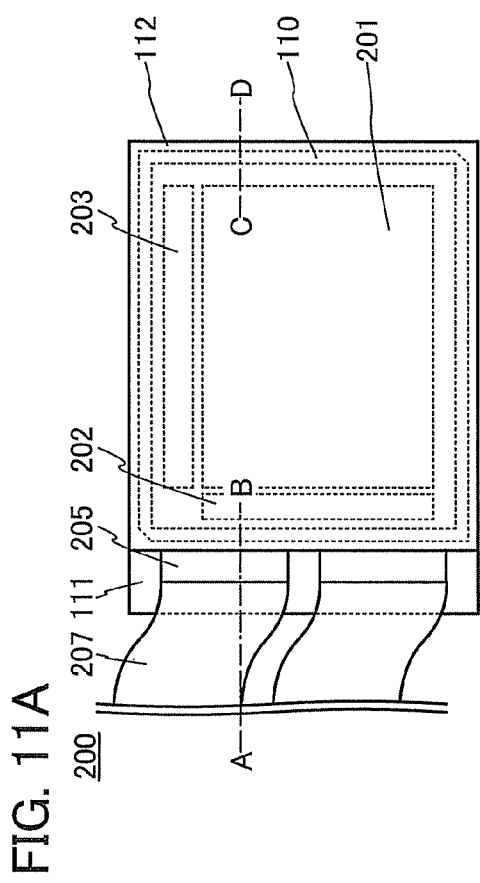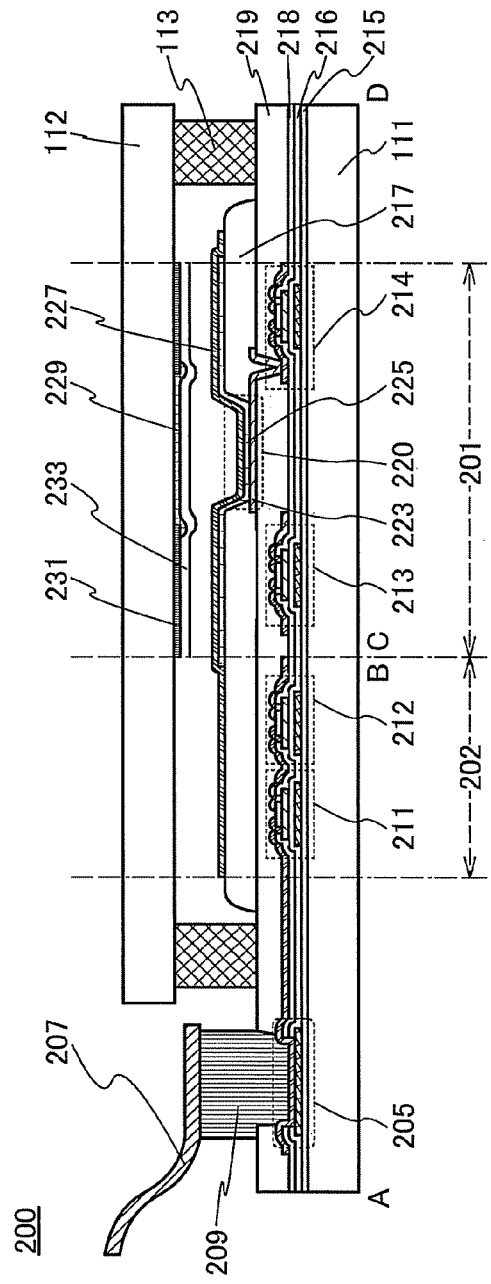

FIG. 15A
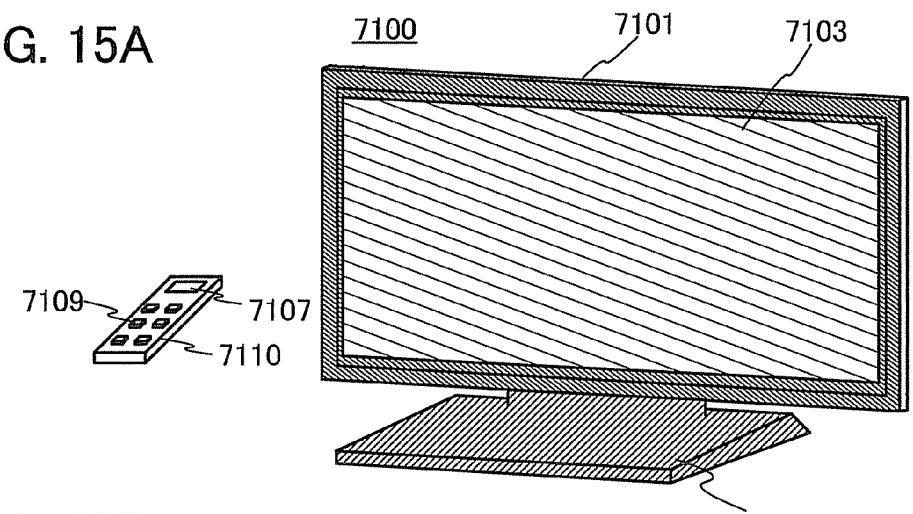
FIG. 15B
FIG. 15C
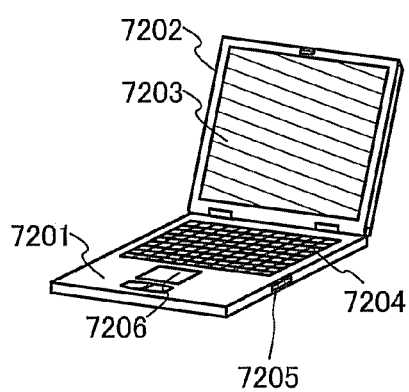
FIG. 15D
FIG. 15E
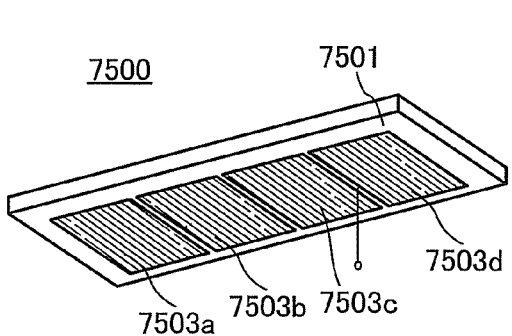

METHOD OF HEATING DISPERSION COMPOSITION AND METHOD OF FORMING GLASS PATTERN

BACKGROUND OF THE INVENTION

1. Field of the Invention

The present invention relates to a method of heating a composition provided over a substrate. The present invention further relates to a method of forming a glass pattern.

2. Description of the Related Art

A technique in which a highly airtight sealed structure is formed in such a manner that two substrates are bonded to each other by a glass layer including low-melting glass is known. In a technique disclosed in Patent Document 1, a sealed structure with high hermeticity is formed as follows: a paste containing a binder and glass fits (denoted by a "frit material" in the document) including low-melting glass is applied to a glass substrate along an edge of the glass substrate; by baking of the paste, the binder is removed and the glass fits are melted to form a glass layer (denoted by "frit glass" in the document); and the glass layer is irradiated with a laser beam with the substrate overlapping with a counter substrate, so that the glass layer is welded to the substrate and the counter substrate.

Since such a glass layer has a high gas barrier property, a sealed space can be kept away from the external atmosphere. A method of sealing using such a glass layer is applied to a device employing an element, such as an organic EL (electroluminescent) element, whose performance is rapidly impaired once the element is exposed to air (including moisture or oxygen).

Examples of the device employing an organic EL element are a lighting device using an organic EL element as a light source, an image display device in which a thin film transistor and an organic EL element are combined, and the like. An organic EL element can be formed into a film and can easily form a large-area element, which leads to a lighting device including a planar light source. In addition, an image display device using an organic EL element needs no, backlight which is necessary for a liquid crystal display device and the like, and accordingly, can achieve a thin, lightweight, high contrast, and low power consumption display device.

Reference

[Patent Document 1] Japanese Published Patent Application No. 2011-65895

SUMMARY OF THE INVENTION

As described above, in the method of manufacturing a sealed structure with the glass layer, baking for removing the binder is necessary after the paste containing the glass fits and the binder (hereinafter referred to as a frit paste) is applied to the substrate. The removal of the binder enables the glass layer which has been irradiated with the laser beam to have a high gas barrier property. In general, the removal of the binder requires baking at a high temperature of about 350° C. to 450° C., although that depends on a material used for the binder.

Baking at a high temperature cannot be employed for the substrate to which the frit paste is applied in some cases, for example, when a material having low heat resistance is provided over the substrate. Examples of the material having low heat resistance in a device using an organic EL element are an organic EL element, a color filter, an optical adjustment film for improving light extraction efficiency, such as a microlens array, and the like.

When the baking of the frit paste is insufficient, the binder or the like might remain in the glass layer which has been irradiated with the laser beam, resulting in low hermeticity. Alternatively, a crack might be generated in the glass layer to break the sealing.

The present invention is made in view of the foregoing technical background. Thus, an object of one embodiment of the present invention is to provide a method of heating a composition which can also be used for a substrate provided with a material having low heat resistance. Another object is to provide a method of forming a glass pattern which leads to reduction of cracks.

One embodiment of the present invention solves at least one of the above problems.

In order to achieve the above object, the present invention has arrived at the following idea: irradiation with a laser beam is performed to bake the paste through local heating after the frit paste is applied to the substrate.

In a conventional method, as a laser beam used for local heating, a laser beam (hereinafter, also referred to as a circular laser beam) whose beam spot has a substantially circular shape and intensity distributions having substantially circular symmetry has been used.

However, application of the circular laser beam to the bake of the frit paste has the following problem.

FIG. 17A schematically illustrates a beam spot shape of a circular laser beam and intensity distributions thereof. A circular laser beam 10 has intensity distributions having substantially circular symmetry: for example, an intensity distribution in a section X1-X2 corresponding to the diameter in the horizontal direction of this figure and an intensity distribution in a section Y1-Y2 corresponding to the diameter in the vertical direction of this figure are substantially the same. In FIG. 17A, the intensity is lower at portions closer to the periphery; however, the intensity can have an ideal flat-top shape.

FIG. 17B schematically illustrates the state in which scan with the circular laser beam 10 is performed along a glass layer 11. The circular laser beam 10 has a beam spot shape with a diameter wider than the width of the frit paste 11 such that a region that is not irradiated with a laser beam is not generated in the frit paste 11. The scan is performed in such a way that the locus of the circle runs along the middle portion of the frit paste 11.

Since the beam spot of the circular laser beam 10 has a substantially circular shape, as illustrated in the figure, the middle portion and the perimeter portion of the glass layer 11 differ in irradiation period and in accumulated values of energy applied to the frit paste 11 even in the case where the circular laser beam 10 has intensity distributions having the ideal flat-top shape. Consequently, the middle portion and the perimeter portion of the glass layer 11 differ in heating temperature.

For example, in the case where conditions (e.g., beam intensity and scanning speed) for irradiation with the circular laser beam 10 are made optimum for the middle portion of the frit paste 11, baking of the perimeter portion is insufficient and consequently the binder remains. In contrast, in the case where the conditions are made optimum for the perimeter portion of the frit paste 11, heating of the middle portion is excessive, resulting in a difference in the melted state between the middle portion and the perimeter portion of the glass fits, which might cause failure in sealing in the next step.

Since thermal shrinkage occurs when the frit paste 11 is cooled after heated, a large temperature distribution in the frit paste during the heating makes a difference in the degree of the thermal shrinkage, which leads to a difference in thermal stress; consequently, a crack might be formed in the glass layer that has been cooled or even in a substrate overlapping with the glass layer due to internal stress in the glass layer. Further, since the substrate is also heated directly or indirectly by the irradiation with a laser beam, a crack might also be formed in the substrate itself by internal stress due to the temperature distribution.

Therefore the present invention focuses on the beam spot shape of a laser beam used for heating of a frit paste and a method of scanning with the laser beam, which solves any of the problems. Specifically, scan with a laser beam is performed so that there can be no difference in the laser beam irradiation period between the middle portion and the perimeter portion of the frit paste. More specifically, irradiation with a laser beam is performed so that the width of the beam spot overlapping with the frit paste in the scanning direction is substantially uniform.

Typically, a laser beam having a rectangular (oblong or square) or elliptical beam spot shape can be used in the present invention. Scan is performed so that two opposite sides of the rectangular beam spot constantly intersect with opposite edges of a pattern of the fit paste.

Specifically, in a method of heating a dispersion composition of one embodiment of the present invention, when a composition including a dispersoid and a disperse medium having a lower boiling point or decomposition temperature than the dispersoid is scanned and irradiated with a laser beam to be heated, the beam spot of the laser beam is shaped into a rectangle and two opposite sides of the rectangle constantly intersect with opposite ends of the composition.

Scan is thus performed with a laser beam along the frit paste in which the glass frits are dispersed in the binder or the like, whereby the frit paste can be uniformly heated without a difference in the laser beam irradiation period between the middle portion and the perimeter portion of the frit paste.

Further, this heating method has a wide variety of applications without limitation to the frit paste. Specifically, the heating method also enables uniform heating of a dispersion composition including a dispersoid and a disperse medium having a lower boiling point or decomposition temperature than the dispersoid.

Another example of such a dispersion composition is an electrically conductive paste in which electrically conductive particles of metal or the like are dispersed in a binder formed of a resin and an organic solvent. In general, in an electrically conductive paste, the particle size of an electrically conductive particle needs to be less than 1 μm so that the temperature for baking can be reduced. In contrast, with the use of the heating method of one embodiment of the present invention, the particle size can be increased because local heating can be uniformly performed, which leads to higher electric conductivity after the baking.

In a method of heating a dispersion composition in accordance with another embodiment of the present invention, the beam spot shape of the above laser beam has a major axis and a minor axis orthogonal to the major axis.

As the above laser beam, use of a laser beam (hereinafter, also referred to as a linear laser beam) having a linear beam spot shape with a major axis and a minor axis orthogonal to the major axis is especially preferred.

For example, with the use of a circular laser beam as the above laser beam, the spot diameter needs to be sufficiently larger than the width of the frit paste to be formed in order to prevent a difference in the irradiation period between the middle portion and the perimeter portion in the frit paste. In this case the area of a region that does not overlap with the frit paste and not contribute to heating of the frit paste is extremely large, and energy is wasted accordingly. In contrast, with the use of the linear laser beam described above, the area of a region that does not contribute to heating of the frit paste can be reduced, so that the frit paste can be efficiently heated.

A larger beam spot area requires higher output in order to achieve the same energy density. When the linear laser beam described above is used, the total beam spot area can be reduced, so that the frit paste can be efficiently heated with lower output than when a circular laser beam is used.

In a method of forming a glass pattern in accordance with one embodiment of the present invention, when a frit paste which includes low-melting glass and a binder and has a closed curve shape is scanned and irradiated with a laser beam to be heated, the beam spot of the laser beam is shaped into a rectangle and two opposite sides of the rectangle constantly intersect with opposite ends of the frit paste.

When a heating method of one embodiment of the present invention is thus applied to a frit paste provided to have a closed curve shape, the frit paste can be uniformly heated even with a substrate provided with a material having low heat resistance, and accordingly a highly reliable sealed structure which has few cracks can be fabricated.

In a method of forming a glass pattern in accordance with another embodiment of the present invention, the beam spot shape of the above laser beam has a major axis and a minor axis orthogonal to the major axis.

When scan with the linear laser beam is performed along the frit paste forming a closed curve to fabricate a sealed structure as described above, the area of a region that is irradiated with the laser beam twice (overlap region) in an irradiation starting region can be extremely small. Accordingly, few cracks are generated and a highly reliable sealed structure can be fabricated.

In the case where scan is performed while the minor axis of the linear laser beam is tilted to the scanning direction thereof, an angle formed between the minor axis and the scanning direction is preferably greater than or equal to 0° and less than or equal to 60°. When a region having a uniform width is irradiated, the necessary length of the major axis direction of the beam spot is proportional to $1/\cos(\theta)$, where $\theta$ represents the angle formed between the minor axis and the scanning direction. Therefore, when this angle exceeds 60°, the necessary length of the major axis direction of the linear laser beam increases suddenly, and accordingly the necessary beam spot area enlarges suddenly. When this angle is less than or equal to 60°, the beam spot area can be small.

In a method of forming a glass pattern in accordance with another embodiment of the present invention, which includes the steps of the above method of forming a glass pattern, the frit paste is provided to have a closed curve shape with four sides in which two pairs of opposite sides are parallel, and scan with the laser beam is performed so that an angle formed between the minor axis and each of the sides of the frit paste is greater than or equal to 0° and less than or equal to 60° and so that the minor axis is turned 90° at a corner portion connected to two sides of the closed curve shape which are not opposite to each other.

In such a method, the laser irradiation step can be completed by one-time scan along the frit paste forming a closed curve shape; thus, process simplification can be achieved.

Further, a sealed structure sealed with a glass layer with corner portions having the same shapes can be fabricated. By having the same shapes, the corner portions do not differ in residual stress caused by internal deformation, which leads to a highly reliable sealed structure. In addition, both the outer edge and the inner edge of each corner portion can be shaped like an arc. With such corner portions having a curvature, internal stress in the glass layer can be diminished, so that generation of a crack can be made more difficult. In this case, the curvature radius is preferably large.

In a method of forming a glass pattern in accordance with another embodiment of the present invention, which includes the steps of the above method of forming a glass pattern, the frit paste is provided to have a closed curve shape with four sides in which two pairs of opposite sides are parallel, and scan with the laser beam is performed so that an angle formed between the minor axis and each of the sides of the frit paste is greater than or equal to 0° and less than or equal to 60° and so that the minor axis is turned 90° in a region between two corner portions connected to one side of the closed curve shape.

In such a method, with corner portions having the same shapes, scan is performed linearly at the corner portions, whereby uniform irradiation can be performed without generating a difference in the laser beam irradiation period between the inner portion and the perimeter portion; thus, a sealed structure which has few cracks can be fabricated.

In a method of forming a glass pattern in accordance with another embodiment of the present invention, which includes the steps of the above method of forming a glass pattern, the frit paste is provided to have a closed curve shape with four sides in which two pairs of opposite sides are parallel, and scan with the laser beam is performed so that an angle formed between the minor axis and each of the sides of the frit paste is 45°.

When scan is performed with the minor axis tilted 45° to the scanning direction of the linear laser beam as described above, scan with the linear laser beam can be performed along the frit paste without turning the linear laser beam even in the case where the scanning direction is turned 90° at a corner portion of the substrate or the like.

When the angle formed between the minor axis direction and the scanning direction is set to 45°, scan can be performed while this angle is constantly kept 45° over the four sides of the frit paste, especially in the case where a right angle is formed between two sides of the frit paste which are not opposite to each other. Hence, even when conditions for the irradiation with the laser beam are common to the two sides that are not opposite to each other, the heating state of the frit paste can be equalized and the welded state of the glass frits can be uniform; thus, a highly reliable sealed structure can be filmed.

Note that in this specification and the like, the expression a substantially uniform width is not limited to a completely uniform width and a width is substantially uniform as long as the length of the narrowest portion is 90% or more of that of the widest portion.

Note that the term closed curve in this specification and the like means a continuous curve having no end points. The term curve here includes the concept of straight line and line segment in a broad sense. Therefore, a component which includes a plurality of line segments each having an end point overlapping with any of the other end points, such as a periphery of a quadrilateral, is also one mode of the closed curve shape. Further, a circle, an ellipse, a shape in which a plurality of curves having different curvatures is continuously connected, a shape including a straight linear portion and a curve portion, and the like are also modes of the closed curve shape.

In this specification and the like, the term direction means not only a given direction but also a direction obtained by turning the given direction 180 degrees, that is, a direction opposite to the given direction. Further, a direction is referred to as an orientation in some cases. Furthermore, the term parallel in this specification and the like means not only the state in which directions are exactly parallel to each other but also the state in which an angle formed between directions that are parallel to each other is within ±10°. The term orthogonal in this specification and the like means not only the state in which directions exactly orthogonal to each other but also the state in which an angle formed between directions that are orthogonal to each other is within ±10°. The term perpendicular in this specification and the like means not only the state in which directions are exactly perpendicular to each other but also the state in which an angle formed between directions that are perpendicular to each other is within ±10°.

Further, the term angle in this specification and the like means not only an exact angle but also an angle that is deviates by an angle within ±10°. For example, the term right angle means not only an exact right angle but also an angle that is deviates from an exact right angle by an angle within ±10°.

The term an EL layer in this specification and the like means a layer provided between a pair of electrodes of a light-emitting element, and specifically means at least a layer including a light-emitting organic compound (also referred to as a light-emitting layer), or a stack including the light-emitting layer.

The term a light-emitting device in this specification means an image display device, and a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

In accordance with the present invention, a method of heating a composition which is applicable to a substrate provided with a material having low heat resistance can be provided. Further, a method of forming a glass pattern by which generation of a crack can be made difficult can be provided.

BRIEF DESCRIPTION OF THE DRAWINGS

In the accompanying drawings:

FIG. 3 illustrates a linear laser beam in accordance with one embodiment of the present invention;

FIGS. 6A and 6B each illustrate a method of manufacturing a sealed structure in accordance with one embodiment of the present invention;

FIG. 8 illustrates a method of manufacturing a sealed structure in accordance with one embodiment of the present invention;

FIGS. 11A and 11B illustrate a display device in accordance with one embodiment of the present invention;

FIGS. 15A to 15E each illustrate an electronic device in accordance with one embodiment of the present invention;

DETAILED DESCRIPTION OF THE INVENTION

Figure 1A:
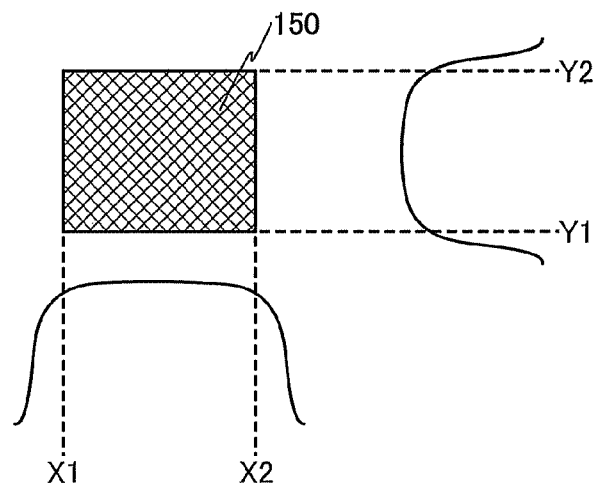
FIGS. 1A to 1C illustrate a laser beam in accordance with one embodiment of the present invention.

Embodiments of the present invention will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note also that in the structures of one embodiment of the present invention described below, the same reference numerals in different drawings represent components that are identical or have similar functions, the description of which is not repeated.

Note that in each drawing of this specification, the size, the thickness, or the region of each component is exaggerated for clarity in some cases. Therefore, embodiments of the present invention are not limited to such scales.

Embodiment 1

In this embodiment, a method of heating a composition and a method of manufacturing a sealed structure in accordance with one embodiment of the present invention are described with reference to FIGS. 1A to 1C, FIGS. 2A to 2F, FIG. 3, FIGS. 4A and 4B, FIGS. 5A to 5F, FIGS. 6A and 6B, FIGS. 7A to 7C, FIG. 8, FIGS. 9A to 9D, and FIGS. 10A and 10B. Here, as one example of the method of heating a composition, a method of heating a frit paste which is one mode of the composition is described. The frit paste is a composition containing low-melting glass frits as a dispersoid and a binder formed of an organic resin and an organic solvent as a disperse medium.

In the heating method of one embodiment of the present invention, scan with a laser beam is performed so that there can be no difference in the laser beam irradiation period between the middle portion and the perimeter portion of the frit paste. Specifically, irradiation with a laser beam is performed so that the width of the beam spot shape overlapping with the frit paste in a direction parallel to the scanning direction is substantially uniform.

Therefore the beam spot shape which is used is a shape in which two opposite sides intersecting with the scanning direction are substantially parallel to each other, such as a quadrilateral such as a rectangle (an oblong or a square) or a parallelogram, or an ellipse, in a region of the beam spot which overlaps with the frit paste. Alternatively, a circular laser beam can be used as long as its spot diameter is sufficiently larger than the width of the frit paste.

<Heating Method Using Laser Beam Having Rectangular Beam Spot>

FIG. 1A schematically illustrates the beam spot shape of a laser beam 150 having a rectangular beam spot, which can be used for the heating method of one embodiment of the present invention, and illustrates the intensity distributions thereof.

Among the intensity distributions in the directions along sides (X1-X2 and Y1-Y2) of the laser beam 150, the intensity distribution in the direction perpendicular to the scanning direction is preferably uniform as much as possible. For example, the intensity distribution in the direction perpendicular to the scanning direction preferably has a flat-top shape. Further, the intensity distribution in the direction parallel to the scanning direction is also preferably uniform, but may have an intensity distribution in which the intensity varies along the direction parallel to the scanning direction like a Gaussian distribution, for example.

Figure 1B:
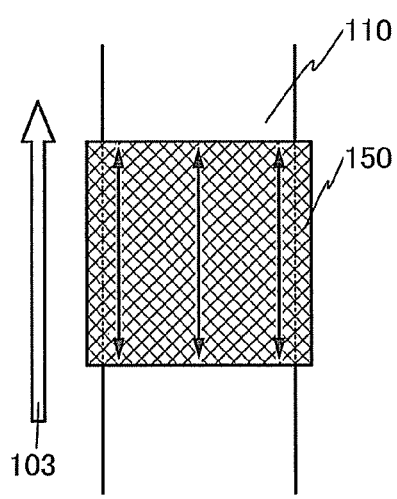

FIG. 1B schematically illustrates the state where scan with the laser beam 150 is performed along the frit paste 110 in the scanning direction 103. Scan with the laser beam 150 is preferably performed in a direction parallel to a pair of opposite sides of the beam spot shape. By such scanning, the middle portion and the perimeter portion of the frit paste are irradiated in one period as indicated by the arrows in the drawing, and thus uniform heating is possible.

Figure 1C:
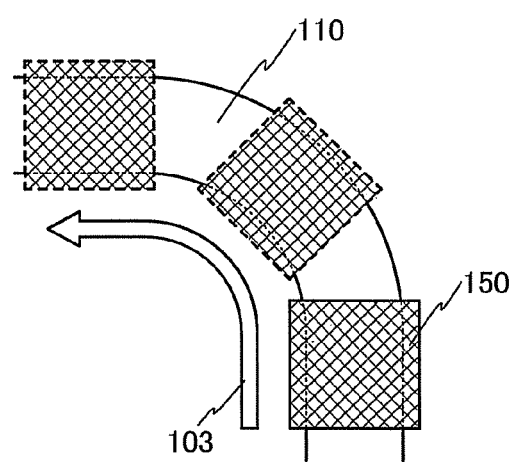

In the case of the frit paste 110 provided to be curved, it is scanned while the laser beam 150 is turned along a curvature of the frit paste 110 as illustrated in FIG. 1C. Thus, even a curved portion can be uniformly heated.

Furthermore, in the case where part of the glass frits in the frit paste 110 are melted by the irradiation with the laser beam 150 and then cooled and solidified, the solidification proceeds uniformly in one direction, so that concentration of a stress at the middle portion can be prevented; accordingly, a residual stress in the glass layer, which may cause a crack, can be reduced.

Here, in particular, when a laser beam having a beam spot shape with a major axis and a minor axis orthogonal to the major axis (linear laser beam) is used as the laser beam, the spot area can be extremely reduced compared with a circular laser beam. Accordingly, the area of a useless region that does not contribute to heating of the frit paste can be reduced, which achieves effective heating of the frit paste. The spot area is preferably reduced also in that the frit paste can be effectively heated with lower output than when a circular laser beam is used.

A method of heating the frit paste using a linear laser beam is described in detail below.

<Spot Shape of Linear Laser Beam>

First, a linear laser beam which can be used for the heating method applicable to one embodiment of the present invention is described.

Figure 2A:
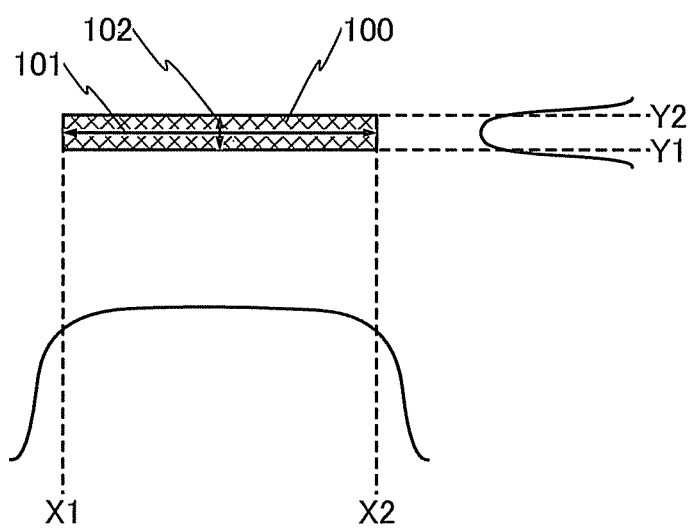
FIGS. 2A to 2F each illustrate a linear laser beam in accordance with one embodiment of the present invention.

FIG. 2A schematically illustrates the beam spot shape of the linear laser beam 100 and the intensity distributions thereof.

The linear laser beam 100 is a laser beam whose beam spot shape on an irradiated surface has a major axis 101 and a minor axis 102 orthogonal to each other. In FIG. 2A, the linear laser beam 100 having an oblong beam spot shape is illustrated.

In terms of the ratio between the major axis 101 and the minor axis 102, the major axis 101 is longer than at least the minor axis 102. Here, when the major axis 101 is 1.3 or more times as long as the minor axis 102, the beam spot area of the laser beam can be smaller than that of a circular laser beam having a diameter the length of which is the same as the length of the major axis 101. When the linear laser beam 100 having such a beam spot shape is used, energy efficiency can be higher than when a circular laser beam is used; accordingly, the fit paste can be efficiently heated with lower output.

The intensity distribution of the linear laser beam 100 in the direction (X1-X2) along the major axis 101 is preferably uniform as much as possible. For example, the intensity distribution in the direction along the major axis preferably has a flat-top shape. In addition, the intensity distribution in the direction (Y1-Y2) along the minor axis 102 is preferably uniform, but may have an intensity distribution in which the intensity varies along the direction (Y1-Y2) like a Gaussian distribution, for example, because the scanning direction and the minor axis 102 are not orthogonal to each other in scan with the linear laser beam 100, as described later.

Figure 2B:
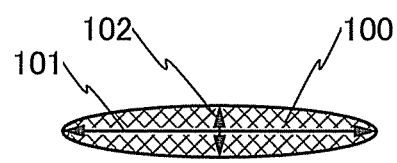
Figure 2C:
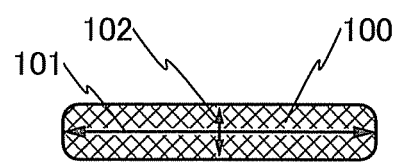

The beam spot of the linear laser beam 100 may take various shapes without being limited to an oblong. For example, the beam spot shape may be an ellipse as illustrated in FIG. 2B or an oblong having rounded corners as illustrated in FIG. 2C.

Figure 2D:
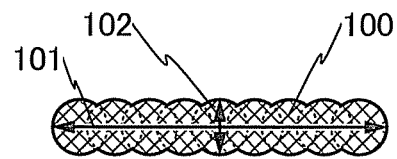
Figure 2E:
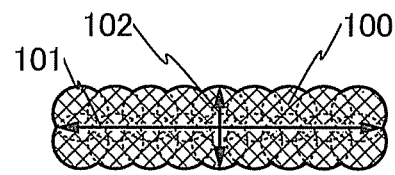
Figure 2F:
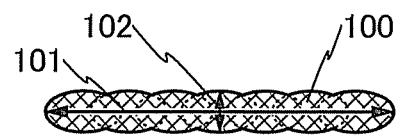

Alternatively, the linear laser beam 100 may be formed in such a way that circular laser beams are overlapped with each other. In FIG. 2D, circular laser beams are partly overlapped with each other in the major axis 101 direction. As in FIG. 2E, circular laser beams are partly overlapped with each other both in the major axis 101 direction and in the minor axis 102 direction. As in FIG. 2F, laser beams having an ellipse beam spot shape are partly overlapped with each other in the major axis 101 direction.

A method of optically Ruining the linear laser beam 100 having a shape described above is described later.

The above explanation is provided of the beam spot shape of the linear laser beam 100.

<Scan with Linear Laser Beam 100>

Next, a scanning method with the linear laser beam 100 for heating the frit paste using the linear laser beam 100 is described.

The frit paste 110 formed over the first substrate 111 is irradiated with the linear laser beam 100. At this time, scan with the linear laser beam 100 is performed along a region where the frit paste 110 is provided. The irradiation with the linear laser beam 100 heats the frit paste 110. The binder is removed by decomposition or volatilization of the organic resin and the organic solvent in the binder. Note that this step is also referred to as prebaking. At this time, the glass fits are partly or wholly welded or aggregated, thereby forming the glass layer including low-melting glass.

At this time, in the solidified glass layer, the glass frits may be completely melted and then welded to form a whole or the glass frits may be partially welded. An absorbent material which can absorb the laser beam with which the irradiation is performed may be dispersed in the glass layer after the prebaking. In addition, it is preferable that the binder be completely removed, although it might fail to be completely removed and remain in the glass layer depending on the conditions for the irradiation with the laser beam.

In order that a sealed structure is fabricated after that, with the second substrate 112 placed to face the first substrate 111 and to be in contact with the glass layer, the glass layer is heated by irradiation with a laser beam or the like through the first substrate 111 or the second substrate 112, and accordingly can be melted and welded to the second substrate 112. Thus, the sealed structure having a sealed region surrounded by the first substrate 111, the second substrate 112, and the glass layer can be fabricated. Note that the glass layer can be heated using the heating method of one embodiment of the present invention and accordingly can be uniformly heated. Thus, a highly reliable sealed structure which has few cracks can be fabricated.

Here, an angle formed between the scanning direction, in which scan is performed with the linear laser beam 100, and the major axis or the minor axis of the beam spot of the linear laser beam is described using FIG. 3. For clarity, FIG. 3 illustrates the relationship between the major axis direction 101a parallel to the major axis 101 of the linear laser beam 100, the minor axis direction 102a parallel to the minor axis 102, and the scanning direction 103 of the linear laser beam 100.

Scan is performed with the linear laser beam 100 while it is held so that the scanning direction 103 and the minor axis direction 102a are not orthogonal to each other, i.e., so that a cosine component of the minor axis direction 102a with respect to the scanning direction 103 is not 0 ($\cos(\theta)$ is not 0).

An angle between the scanning direction 103 and the minor axis 102 ($\theta$ in FIG. 3) is preferably greater than or equal to 0° and less than or equal to 60°. When a region having a uniform width is irradiated, the necessary length of the major axis 101 of the beam spot is proportional to $1/\cos(\theta)$, where $\theta$ represents the angle formed between the minor axis 102 and the scanning direction 103. Therefore, when this angle exceeds 60°, the necessary length of the major axis 101 of the linear laser beam 100 increases suddenly, and accordingly the necessary beam spot area enlarges suddenly. When this angle is less than or equal to 60°, the beam spot area can be small.

Figure 4A:
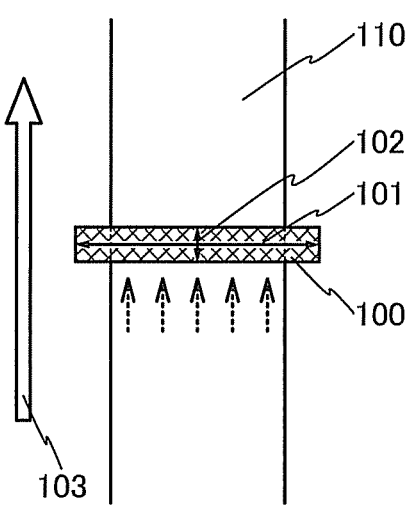
FIGS. 4A and 4B each illustrate a method of scan with a linear laser beam in accordance with one embodiment of the present invention.

Next, FIG. 4A schematically illustrates the case where scan with the linear laser beam 100 is performed along the frit paste 110 so that the angle between the scanning direction 103 and the minor axis 102 can be 0°.

Such scan with the linear laser beam 100 enables uniform heating without a difference in the laser beam irradiation period between the middle portion and the perimeter portion of the frit paste 110.

Further, when the glass frits and the substrate heated by the linear laser beam 100 are cooled, the cooling proceeds in one direction along the scanning direction 103 as indicated by the dashed-line arrow in FIG. 4A, and hence concentration of a stress at the middle portion of the glass layer or the substrate after the solidification can be made difficult. Accordingly, internal deformation in the glass layer or the substrate after the solidification becomes uniform, so that a residual stress, which may cause a crack, can be reduced.

Figure 4B:
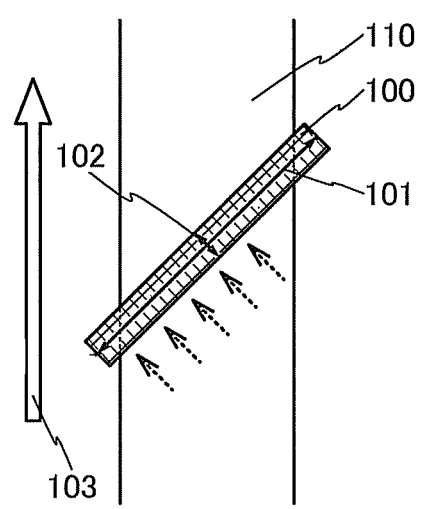

Next, FIG. 4B schematically illustrates the case where scan is performed along the frit paste 110 while the beam spot of the linear laser beam 100 is tilted so that the angle between the scanning direction 103 and the minor axis 102 can exceed 0°.

Also when the linear laser beam 100 is tilted to the scanning direction 103 as described above, uniform heating can be achieved without a difference in the laser beam irradiation period between the middle portion and the perimeter portion of the frit paste 110.

Further, when the glass frits and the substrate heated by the linear laser beam 100 are cooled, the solidification proceeds in one direction which is substantially parallel to the minor axis 102 direction of the linear laser beam 100 as indicated by the dashed-line arrow in FIG. 4B. Accordingly, stress concentration at the glass layer or the substrate after the solidification can be made difficult, so that a residual stress, which may cause a crack, can be reduced.

In the case where the linear laser beam 100 having an ellipse beam spot shape is used, for example, there may be a slight difference in the laser beam irradiation period between the middle portion and the perimeter portion of the frit paste 110. In such a case, scanning speed, output, or the like is preferably adjusted so as to reduce a difference in temperature between the middle portion and the perimeter portion. Further, with the use of the linear laser beam 100 having an ellipse beam spot shape, the irradiation period of the perimeter portion of the frit paste 110 is preferably 90% or more, preferably 95% or more, of the irradiation period of the middle portion.

<Methods of Heating Frit Paste and Manufacturing Sealed Structure>

Examples of a method of heating a frit paste using the above-described linear laser beam and a method of manufacturing a sealed structure including a sealed region surrounded by two opposite substrates and a glass layer are described below.

In formation of the sealed structure, the frit paste is provided over the first substrate so as to have a closed curve shape. Scan with the linear laser beam is performed along the closed curve shape. Specifically, scan with the linear laser beam is performed so that an angle formed between the minor axis direction of the beam spot and the tangent of the closed curve shape is kept in the range greater than or equal to 0° and less than or equal to 60°. A specific scanning method is also described below.

Method Example 1

In this method example, a method in which scan is performed along the frit paste 110 while the minor axis of the linear laser 100 is tilted to the scanning direction 103 to heat the frit paste 110 and a method of manufacturing a sealed structure are described using FIGS. 5A to 5F. FIGS. 5A to 5F are schematic top views of this method example.

First, the frit paste 110 is formed over the first substrate 111. The frit paste 110 is provided to have a closed curve shape having four sides, in which two pairs of opposite sides are parallel. In other words, the frit paste 110 is provided to have a shape which has two pairs of opposite parallel linear portions and in which two linear portions that are not opposite to each other forms a continuous line at a corner portion.

Here, the shape of the corner portion to which the two linear portions that are not opposite to each other are connected may be a right angle, an acute angle, or an obtuse angle. The corner portion may be curved or may have a plurality of obtuse angles.

The shapes of the inner and outer edges of the frit paste 110 forming a closed curve may be different. For example, the inner edge may be a quadrilateral while the outer edge is a polygonal.

The shapes of the corner portion and the inner and outer edges of the frit paste 110 described above are determined as appropriate so as to overlap with a region irradiated with the linear laser beam 100, in accordance with a scanning method with the linear laser beam 100 which is described later.

Figure 5A:
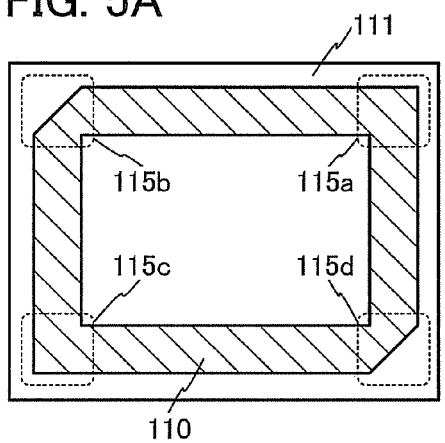
FIGS. 5A to 5F illustrate a method of manufacturing a sealed structure in accordance with one embodiment of the present invention.

In this method example, as illustrated in FIG. 5A, the frit paste 110 is formed so that it has four corner portions (corner portions 115a to 115d) and the inner edge is a quadrilateral while the outer edge is a hexagon, in which each of a pair of opposite corner portions (corner portions 115b and 115d) has two obtuse angles (FIG. 5A).

The frit paste 110 can be formed as follows: a frit paste in which glass fits formed of powder glass are combined with a binder formed of an organic resin diluted with an organic solvent, for example, is applied to the first substrate 111 by a known method such as a screen printing method or a dispensing method.

The glass material used for the glass frits preferably contains one or more compounds selected from, for example, the following group: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass.

After that, the frit paste 110 is scanned and irradiated with the linear laser beam 100. The frit paste 110 is heated and the binder is removed. Hereinafter, the way how scan with the linear laser beam 100 is performed along the frit paste 110 is described below.

Figure 5B:
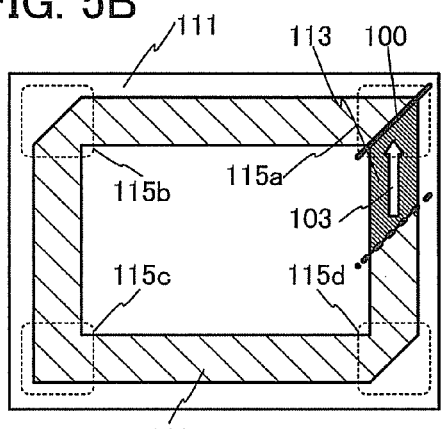

First, the frit paste 110 is scanned with the linear laser beam 100 along one linear portion (also referred to as one side) of the frit paste 110 and irradiated with the laser beam. At this time, irradiation is performed while the minor axis direction of the spot shape of the linear laser beam 100 is tilted to the scanning direction (FIG. 5B). Here, the hatch pattern of the glass layer 113, which has been irradiated with the laser beam and from which the binder has been removed, is different from the hatch pattern of the frit paste 110 for clarity in FIGS. 5A to 5F.

Here, an angle formed between the minor axis direction of the beam spot of the linear laser beam 100 and the scanning direction 103 is preferably set to 45°. When the angle formed between the minor axis direction and the scanning direction 103 is set to 45°, scan can be performed while this angle is constantly kept 45° over the four sides of the frit paste 110, especially in the case where a right angle is formed between two sides of the frit paste 110 which are not opposite to each other. Hence, even when conditions for the irradiation with the laser beam are common to the two sides that are not opposite to each other, the frit paste 110 can be uniformly heated; thus, a highly reliable sealed structure can be formed.

In this method example, the case where the angle formed between the minor axis direction of the beam spot shape of the linear laser beam 100 and the scanning direction 103 is set to 45° is described.

Figure 5C:
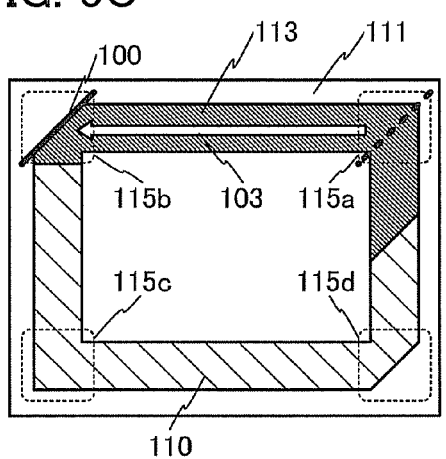

Next, after the linear laser beam 100 reaches the corner portion 115a of the frit paste 110, scan is then performed along the frit paste 110 toward the corner portion 115b (FIG. 5C).

Figure 5D:
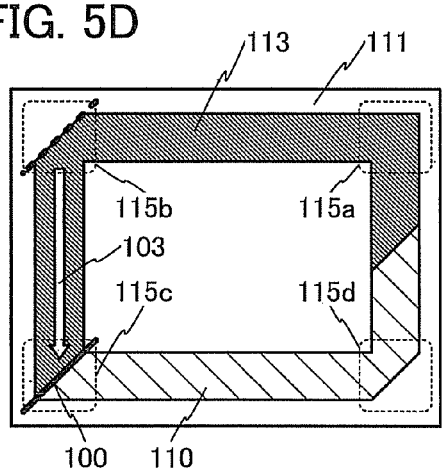

Next, after the linear laser beam 100 reaches the corner portion 115b of the frit paste 110, scan is then performed along the frit paste 110 toward the corner portion 115c (FIG. 5D).

Here, since the minor axis direction of the beam spot of the linear laser beam 100 is tilted to the scanning direction 103 in scanning, part of the corner portion 115b is irradiated with the laser beam twice. Therefore a condition for irradiation with the linear laser beam 100 is preferably changed at the corner portion 115b. For example, at the corner portion 115b, scanning speed is increased or irradiation intensity is reduced.

Figure 5E:
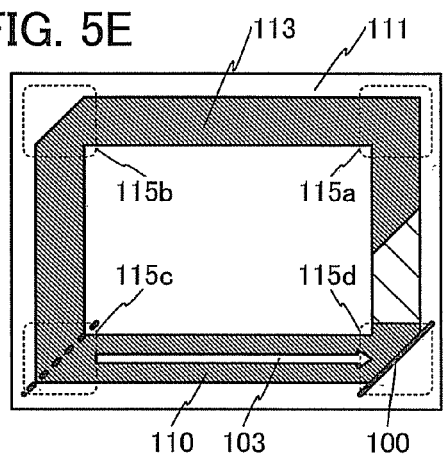

After that, scan with the linear laser beam 100 is performed as described above along the frit paste 110 from the corner portion 115c toward the corner portion 115d (FIG. 5E).

Figure 5F:
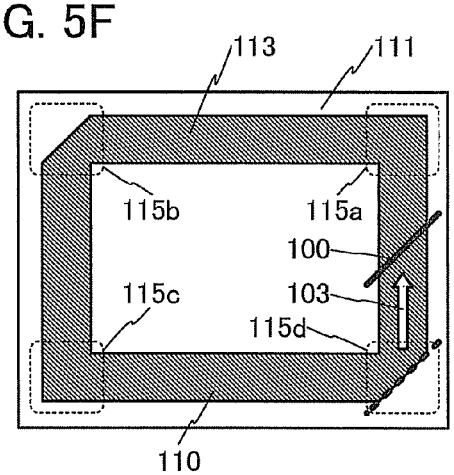

After the linear laser beam 100 reaches the corner portion 115d, scan with the linear laser beam 100 is performed to an irradiation starting region between the corner portion 115d and the corner portion 115a (FIG. 5F). At this time a condition for irradiation with the linear laser beam 100 is preferably changed at the corner portion 115d, as at the corner portion 115b.

Thus, the frit paste 110 provided over the first substrate 111 is heated, so that the binder can be removed.

In one embodiment of the present invention, because of the use of the linear laser beam 100, the area of the region that is irradiated with the laser beam twice (also referred to as an overlap region) in the irradiation starting region can be extremely smaller than that with the use of a circular laser beam. The heat history of the overlap region is different from that of the other region, and therefore the welded state of the glass layer 113, from which the binder is removed and which is solidified, or internal deformation generated in the substrate might be different from that in the other region; hence, such a difference might cause stress concentration to generate a crack. By use of the linear laser beam 100, the area of the overlap region can be extremely small; accordingly, few cracks are generated and a highly reliable sealed structure can be fabricated.

After that, a second substrate is placed to face the first substrate 111 and to be in contact with the glass layer 113.

Next, the glass layer 113 is scanned and irradiated with a laser beam through the first substrate 111 or the second substrate 112 so that the glass layer 113 is melted and solidified; accordingly the glass layer 113 is welded to the second substrate 112. At this time, the glass layer 113 and the second substrate 112 are preferably treated while a pressure is applied so that they can be in contact with each other without fail. The glass layer 113 and the second substrate 112 may be treated while interposed using a clamp or the like outside the region irradiated with the laser beam, or may be treated while a pressure is uniformly applied to a substrate surface from one or both of the first substrate 111 and the second substrate 112.

At this time, the inside of the sealed region is preferably brought into an inert gas atmosphere or a reduced pressure atmosphere after the irradiation with the laser beam. For example, before the irradiation with the laser beam, a sealing material such as an ultraviolet curable resin or a thermosetting resin is formed in advance outside or inside a region where the frit paste 110 is applied; then, the two substrates are temporarily bonded to each other with the sealing material in an inert gas atmosphere or a reduced pressure atmosphere and then irradiated with the laser beam in an air atmosphere or an inert gas atmosphere. When the sealing material is provided to have a closed curve shape, the structure of an apparatus can be simplified because the inside of the sealed region is kept in an inert gas atmosphere or a reduced pressure atmosphere and the irradiation with the laser beam can be performed in an air atmosphere. Further, when the inside of the sealed region is brought into a reduced pressure atmosphere in advance, the irradiation with the laser beam can be performed while the glass layer 113 and the second substrate 112 are in contact with each other without fail due to a pressure difference, without using a mechanism such as a clamp for pressing the two substrates.

Note that the above-described heating method using the linear laser beam 100 is also preferably applied to the step of irradiating the glass layer 113 with a laser beam. With the use of the linear laser beam 100, the glass layer 113 can be uniformly heated, which reduces internal stress in the glass layer 113 after the solidification. Accordingly, a highly reliable sealed structure which has few cracks can be fabricated.

Method Example 2

A method of heating the fit paste 110, which is different from that in the above method example, is described. The linear laser beam 100 used in this method example not only can be used for scan along the frit paste 110 but also can be turned around a turn axis perpendicular to an irradiated surface.

Scan with the linear laser beam 100 is performed along the frit paste 110 provided to have a closed curve shape having four sides in which two pairs of opposite sides are parallel so that the beam spot can be turned 90° at a corner portion or in a region between two corner portions that are not opposite to each other, whereby the glass layer 113 with corner portions having the same shapes can be manufactured.

FIGS. 6A and 6B illustrate examples of methods in each of which scan is performed so that the beam spot of the linear laser beam 100 can be turned 90° at a corner portion.

In the method illustrated in FIG. 6A, the angle funned between the minor axis direction of the beam spot of the linear laser beam 100 and the scanning direction 103 is greater than or equal to 0° and less than or equal to 60° over a linear portion (side) of the frit paste 110. In this method example, scan is performed so that the angle can be 0°.

When the linear laser beam 100 reaches the corner portion, scan is performed in such a way that the linear laser beam 100 is turned around a turn axis 117. At this time, the linear laser beam 100 is turned so that one end in the major axis direction of the linear laser beam 100 can constantly correspond to the turn axis 117.

After that, scan with the linear laser beam 100 is performed along the frit paste 110. At this time, since the beam spot of the linear laser beam 100 is turned 90° at the corner portion, the angle formed between the minor axis direction and the scanning direction 103 can constantly be the same (0° here) on the two sides forming a continuous line at the corner portion.

The shape of the frit paste 110 at the corner portion is adjusted so that it can overlap with a region irradiated with the linear laser beam 100. In FIG. 6A, the frit paste 110 is provided so as to have an inner edge having a right angle and an outer edge having two obtuse angles at the corner portion.

By scan at the four corner portions of the frit paste 110 as described above, a sealed structure sealed with the glass layer 113 with corner portions having the same shapes can be fabricated. By having the same shapes, the corner portions do not differ in residual stress caused by internal deformation, which leads to a highly reliable sealed structure.

In FIG. 6B, the turn axis 117 does not correspond to one end in the major axis direction of the linear laser beam 100. Scan is performed so that the beam spot of the linear laser beam 100 can be turned around a point on the extension of the major axis, which serves as the turn axis 117.

Such scan can reduce a difference in the laser beam irradiation period between the inner portion and the perimeter portion when the beam spot of the linear laser beam 100 is turned. Accordingly, variation in the heating temperatures of the frit paste 110 at the corner portion can be small, so that internal stress generated in the glass layer 113 or the substrate after the heating can be diminished and few cracks are generated at the corner portion.

As illustrated in FIG. 6B, the outer and inner edges of each corner portion can be shaped like an arc. With such curved corner portions, internal stress in the glass layer 113 can be diminished, so that generation of a crack can be made more difficult. In this case, the curvature radius is preferably large.

Method Example 3

In this method example, a method in which the beam spot of the linear laser beam 100 is turned in a region including a linear portion (side) of the fit paste 110 is described, although the method in which the beam spot is turned at a corner portion is described in the above Method example 2.

Figure 7A:
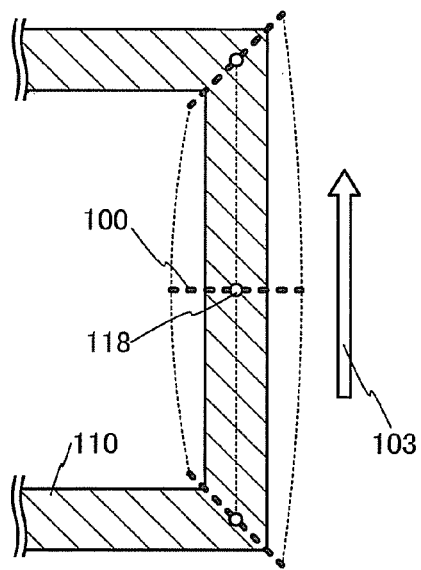
FIGS. 7A to 7C each illustrate a method of manufacturing a sealed structure in accordance with one embodiment of the present invention.

FIG. 7A illustrates the state in which scan is performed so that the beam spot of the linear laser beam 100 can be turned 90° between two corner portions that are not opposite to each other. In FIG. 7A, scan is performed so that the locus of a center 118 of the linear laser beam 100 can be parallel to the scanning direction 103.

When scan is thus performed so that the center 118 of the beam spot of the linear laser beam 100 can overlap with the middle portion of the frit paste 110, use of an end portion of the linear laser beam 100, which has a relatively low intensity, is unnecessary and accordingly the frit paste 110 can be uniformly heated.

Figure 7B:
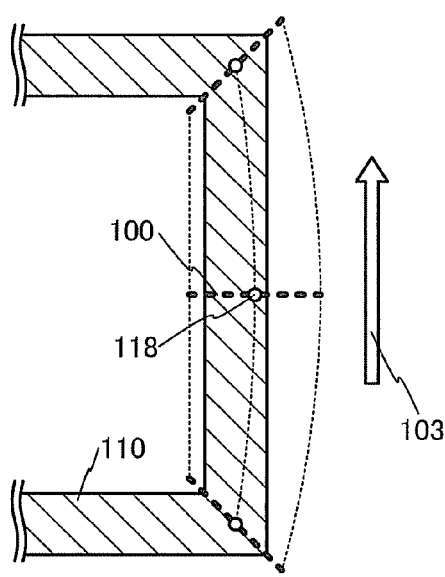
Figure 7C:
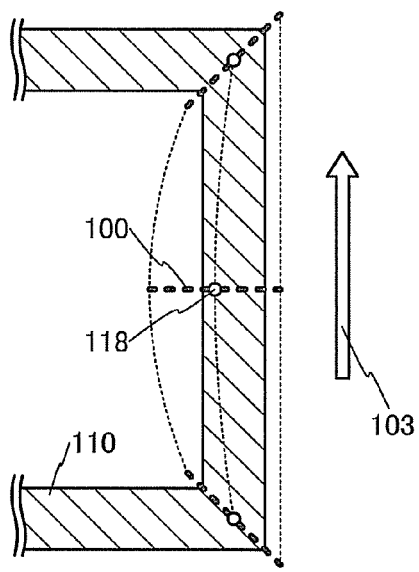

Alternatively, the locus of the center 118 of the beam spot of the linear laser beam 100 can be shaped like an arc, as illustrated in FIGS. 7B and 7C.

For example, in order that the area of a portion inside the sealed region which is irradiated with the laser beam can be reduced, specifically, in order that a circuit element, a light-emitting element, or the like can be formed even in the vicinity of the frit paste 110, scan is performed so that the locus of the center 118 can be shaped like an arc outside the sealed region as in FIG. 7B. Consequently, the locus of the laser beam in the sealed region can be linear.

In contrast, in order that the area of a portion outside the sealed region which is irradiated with the laser beam can be reduced, specifically, in order that a display device with a narrow frame can be formed, scan is performed so that the locus of the center 118 can be shaped like an arc inside the sealed region as in FIG. 7C. Consequently, the locus of the laser beam outside the sealed region can be linear.

In the scanning method illustrated in FIG. 8, scan is performed so that the beam spot of the linear laser beam 100 can be turned 90° at a linear portion and so that an angle between the minor axis direction and the scanning direction can be 45° at the corner portion as described in the above method example. Note that although scan is performed so that the locus of the center 118 can be parallel to the scanning direction at a linear portion in FIG. 8, the locus may be shaped like an arc as described above.

In such a scanning method, the glass layer 113 with corner portions having the same shapes can be formed and uniform irradiation can be performed by linear scan at the corner portions without generating a difference in the laser beam irradiation period between the middle portion and the perimeter portion; thus, a sealed structure which has few cracks can be fabricated.

The above explanation is provided of the scanning method with the linear laser beam 100.

[Method of Forming Linear Laser Beam 100]

A method of optically forming the linear laser beam 100 is described below.

As an exit hole through which the laser beam is emitted, for example, an optical fiber is used and may be directly connected to a laser oscillator so that the laser beam can be extracted. Any of mirrors and lenses may be combined so that the laser beam can be extracted.

Here, by using an optical fiber as described above whose cross section is a square, the laser beam 150 having a square beam spot shape as exemplified in FIGS. 1A to 1C can be formed. Alternatively, by using an optical fiber whose cross section is an oblong, the linear laser beam 100 having an oblong beam spot shape with a major axis and a minor axis orthogonal to the major axis can be formed. Further alternatively, concentration of light with a mirror or a lens may be utilized to form a square or oblong beam spot on an irradiated surface so that the laser beam 150 or the linear laser beam 100 can be formed.

Alternatively, the linear laser beam 100 can also be fainted in such a way that circular laser beams are overlapped with each other. FIGS. 9A to 9D are schematic views each illustrating the case where circular laser beams emitted through exit holes 121 to an irradiated surface 123 are overlapped with each other to form the linear laser beam 100.

Figure 9A:
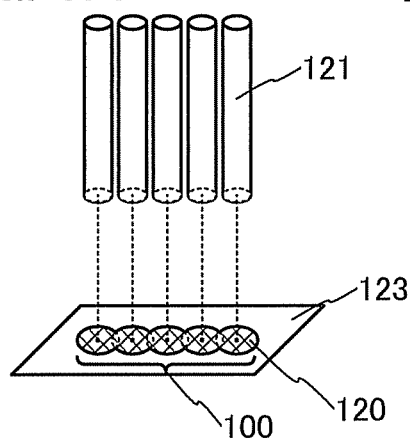
FIGS. 9A to 9D each illustrate a linear laser beam in accordance with one embodiment of the present invention.

In FIG. 9A, the exit holes 121 are arranged at equal intervals on a straight line and the circular laser beams 120 emitted through the exit holes 121 are overlapped with each other; thus, the linear laser beam 100 having a linear beam spot can be formed on the irradiated surface 123.

In this case, when the exit holes 121 are arranged so that the beam spots of the circular laser beams 120 can be partly overlapped with each other, the intensity distribution in the major axis direction of the beam spot of the linear laser beam 100 can be made closer to a uniform distribution.

Figure 9B:
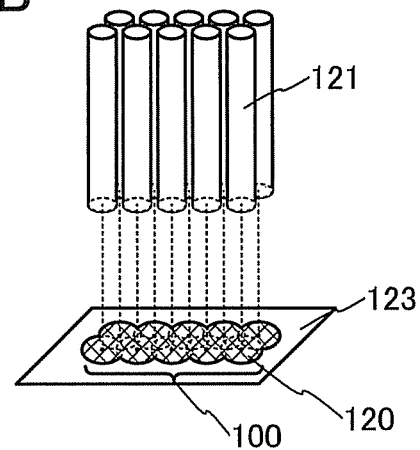

Alternatively, as illustrated in FIG. 9B, a matrix of exit holes 121 may be arranged in the horizontal and vertical directions to form the linear laser beam 100. This structure leads to uniform intensity distribution in the minor axis direction of the linear laser beam 100 and a wide width in the minor axis direction.

Figure 9C:
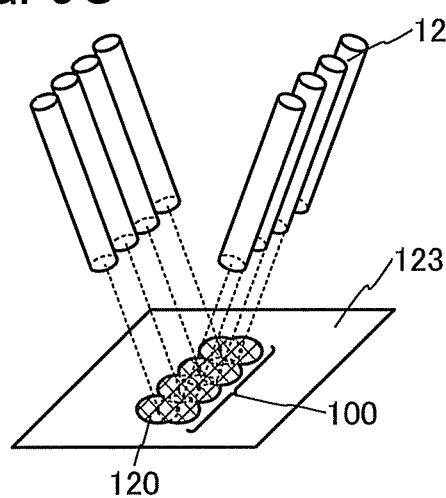

Alternatively, as illustrated in FIG. 9C, groups of exit holes including the plurality of exit holes 121 arranged at equal intervals on a straight line may be arranged while being tilted to the direction perpendicular to the irradiated surface 123 so that the circular laser beams 120 emitted through the plurality of exit holes 121 can be condensed on the irradiated surface 123 to form the linear laser beam 100. This structure can improve the intensity distributions of the linear laser beam 100 and reduce the width in the minor axis direction.

Figure 9D:
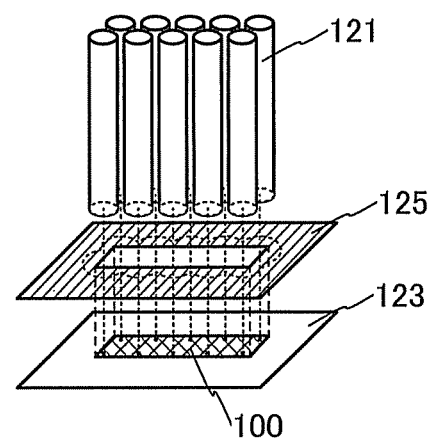

Alternatively, as illustrated in FIG. 9D, a light-blocking mask 125 having an opening may be provided between the plurality of exit holes 121 and the irradiated surface 123 so that the linear laser beam 100 having a beam spot shape reflecting the shape of the opening of the light-blocking mask can be formed. When the light-blocking mask blocks an outer end portion of the laser beam 100, which has a relatively low intensity, in this way, the intensity distributions of the linear laser beam 100 are improved and the beam spot of the linear laser beam 100 can take any shape.

A lens may be used to condense the linear laser beam 100 on the irradiated surface 123.

Figure 10A:
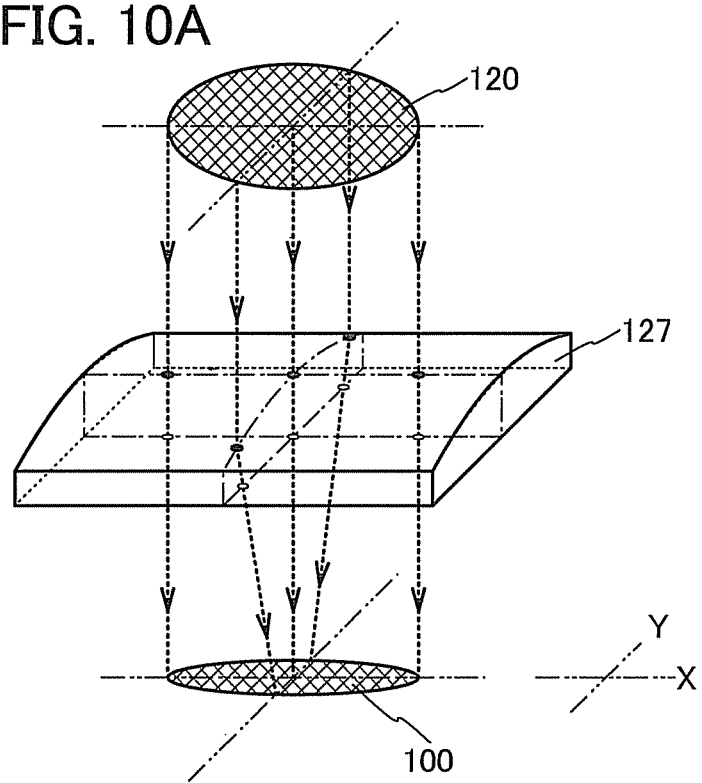
FIGS. 10A and 10B each illustrate a linear laser beam in accordance with one embodiment of the present invention.

FIG. 10A is a schematic view illustrating the case where a cylindrical lens 127 is used to condense the circular laser beam 120 so that the linear laser beam 100 having an ellipse beam spot can be formed.

The cylindrical lens 127 can converge or diverge light only in one axis direction. As illustrated in FIG. 10A, when the circular laser beam 120 enters the cylindrical lens 127, the circular laser beam 120 is converged only in the Y axis direction, so that it has an ellipse beam spot after passing through the cylindrical lens 127. Thus, the linear laser beam 100 can be formed with the circular laser beam 120.

Instead of the cylindrical lens 127, a toroidal lens with different curvatures in two orthogonal axes may be used. The toroidal lens enables concentration of light or divergence also in the major axis direction, so that not only the length of the minor axis of the beam spot but also the length of the major axis thereof can be controlled. Alternatively, an aspheric lens or the like may be used for concentration of light so that a desired beam spot can be obtained.

Figure 10B:
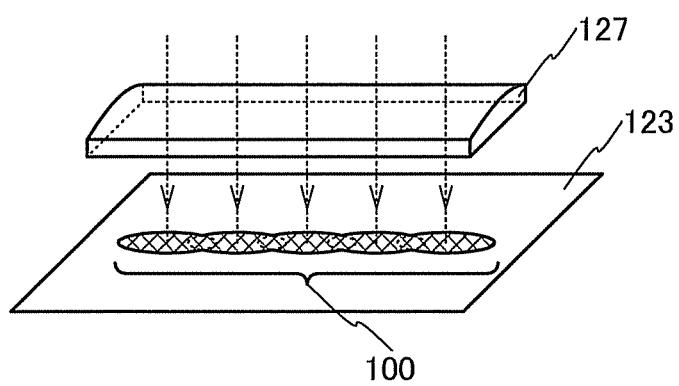

Alternatively, as illustrated in FIG. 10B, a plurality of circular laser beams may be condensed on the irradiated surface 123 through the cylindrical lens 127 so that the beam spots of the circular laser beams can be partly overlapped with each other to form the linear laser beam 100. With this structure, the linear laser beam 100 can have a narrow width in the minor axis direction and high energy density.

Note that when scan is performed in such a way that the beam spot of the linear laser beam 100 is turned, groups of exit holes are provided capable of being turned around the axis perpendicular to the irradiated surface. Alternatively, when a lens is used, the lens is provided capable of being turned.

Alternatively, the irradiated surface may be provided capable of being turned while the beam spot of the linear laser beam 100 is not turned. For example, as a stage supporting a substrate having a surface to be irradiated, a stage which is not only movable in the X-direction and the Y-direction but also provided with a turn axis perpendicular to the X-Y plane is used.

This embodiment can be combined with any of the other embodiments described in this specification as appropriate.

Embodiment 2

In this embodiment, a light-emitting device to which the method of heating a frit paste and the method of manufacturing a sealed structure which are exemplified in the above embodiment can be applied is described. Hereinafter, as examples of the light-emitting device, display devices to which an organic EL element is applied are described with reference to FIGS. 11A and 11B and FIG. 12.

The heating method and the method of manufacturing a sealed structure in accordance with one embodiment of the present invention can be applied to a passive matrix (simple matrix) display device or an active matrix display device including an organic EL element. In the following structural examples, active matrix display devices are exemplified.

Structural Example 1

In this structural example, a display device to which an organic EL element is applied will be described with reference to FIGS. 11A and 11B.

FIG. 11A is a schematic top view of a display device 200 of one embodiment of the present invention. The display device 200 exemplified in this structural example has a so-called top-emission structure, in which light is emitted opposite to a substrate provided with a light-emitting element.

In the display device 200, a display portion 201, a scan line driver circuit 202, and a signal line driver circuit 203 are included in a sealed region surrounded by the first substrate 111, the second substrate 112, and the glass layer 113. Further, a wiring which is electrically connected to the scan line driver circuit 202 and the signal line driver circuit 203 extends from the sealed region, and the wiring is electrically connected to an external input terminal 205. A power source potential and a signal such as a driving signal for driving the scan line driver circuit 202, the signal line driver circuit 203, and the like can be input through an FPC 207 which is electrically connected to the external input terminal 205.

FIG. 11B is a schematic cross-sectional view along the line A-B and the line C-D, which cuts regions including the external input terminal 205, the scan line driver circuit 202, and the display portion 201.

As a material for the substrate provided on the side from which light is extracted, a material having a light-transmitting property, such as glass or quartz, can be used. A material for the substrate provided on the side opposite to the side from which light is extracted does not necessarily have a light-transmitting property, and a material such as a metal, a semiconductor, or ceramics can be used as well as the above materials. In the case where an electrically conductive substrate is used, it preferably has an insulating property by having an oxidized surface or a surface provided with an insulating film. An organic resin can also be used as long as it is resistant to heat during the process. In the case where a material other than glass is used, an oxide film is preferably formed at least in a region in contact with the glass layer so as to improve adhesion.

The substrate to be provided with a light-emitting element or a transistor is preferably heated in advance so as to be enough to shrink so that an impurity such as water, hydrogen, or oxygen adsorbed on the substrate or its surface can be reduced. This heating reduces the dispersion of an impurity in the process of fabricating the light-emitting element or the transistor, leading to a highly reliable light-emitting device.

The external input terminal 205 is formed with an electrically conductive layer included in transistors or a light-emitting element in the display device 200. In this structural example, the external input terminal 205 is formed with a stack of an electrically conductive layer used as gates of the transistors and an electrically conductive layer used as electrodes of the transistors. Forming the external input terminal 205 with a stack of a plurality of electrically conductive layers is preferred to increase strength. Further, a connector 209 is provided in contact with the external input terminal 205. The FPC 207 is electrically connected to the external input terminal 205 through the connector 209. For the connector 209, it is possible to use a paste-form or sheet-form material which is obtained by mixture of metal particles and a thermosetting resin and for which anisotropic electric conductivity is provided by thermocompression bonding. As the metal particles, particles in which two or more kinds of metals are layered, for example, Ni particles coated with Au are preferably used.

In FIG. 11B, the scan line driver circuit 202 includes an NMOS circuit in which n-channel transistors, transistors 211 and 212, are used in combination, as an example. The scan line driver circuit 202 is not limited to an NMOS circuit and may have a variety of circuits such as a CMOS circuit in which an n-channel transistor and a p-channel transistor are used in combination or a PMOS circuit formed of a p-channel transistor. Note that the same applies to the signal line driver circuit 203. Although a driver-integrated structure in which the scan line driver circuit 202 and the signal line driver circuit 203 are formed over the substrate provided with the display portion 201 is described in this structural example, the scan line driver circuit 202 or the signal line driver circuit 203, or both may be formed over a substrate different from the substrate provided with the display portion 201.

FIG. 11B illustrates a cross-sectional structure of one pixel as an example of the display portion 201. The pixel includes a switching transistor 213, a current control transistor 214, and a pixel electrode 223 that is electrically connected to an electrode (a source electrode or a drain electrode) of the current control transistor 214. In addition, an insulating layer 217 is formed to cover an end portion of the pixel electrode 223.

Note that there is no particular limitation on the structures of the transistors included in the display portion 201, the scan line driver circuit 202, and the signal line driver circuit 203. For example, a forward staggered transistor or an inverted staggered transistor may be used. Furthermore, a top-gate transistor or a bottom-gate transistor may be used. As a material of a semiconductor used for the transistors, for example, a semiconductor material such as silicon or germanium or an oxide semiconductor containing at least one of indium, gallium, and zinc may be used. Further, there is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

A light-emitting element 220 includes the pixel electrode 223, an EL layer 225, and a common electrode 227. The structure, material, and the like of the light-emitting element will be described in detail in a later embodiment.

As electrically conductive materials used for the pixel electrode 223 and the common electrode 227, a material that transmits light emission from the EL layer 225 is used for an electrode to which light is emitted, and a material that reflects light emission from the EL layer 225 is used for an electrode provided on the side opposite to the electrode to which light is emitted.

In this structural example, a reflective material is used for the pixel electrode 223 and a light-transmitting material is used for the common electrode 227. Thus, light emission from the EL layer 225 is transmitted through the second substrate 112.

As the light-transmitting material that can be used for the electrode to which light is emitted, an electrically conductive oxide such as indium oxide, indium tin oxide, indium zinc oxide, zinc oxide, zinc oxide to which gallium is added, graphene, or the like can be used. Other examples of the material that can be used for the electrically conductive layers are a metal material such as gold, silver, platinum, magnesium, nickel, tungsten, chromium, molybdenum, iron, cobalt, copper, palladium, and titanium; an alloy material containing any of these metal materials; and a nitride of any of these metal materials (e.g., titanium nitride). Note that when a metal material (or a nitride thereof) is used, its thickness is reduced so that light-transmitting property can be obtained. Alternatively, a stack of films of any of the above materials can be used as the electrically conductive layers. For example, a stack of films of a silver-magnesium alloy and indium tin oxide is preferably used to increase electric conductivity.

Note that a film of the electrically conductive oxide used as the electrode to which light is emitted can be formed by a sputtering method. When an electrically conductive oxide film is formed under an atmosphere containing argon and oxygen, the light-transmitting property can be increased.

Further, in the case of the top-emission structure, the electrically conductive oxide film formed over the EL layer 225 is preferably a stack of a first electrically conductive oxide film formed under an atmosphere containing argon with reduced oxygen concentration and a second electrically conductive oxide film formed under an atmosphere containing argon and oxygen, in which case damage to film formation for the EL layer 225 can be reduced. In this case, in the formation of the first electrically conductive oxide film, it is preferable to use an argon gas with purity, for example, an argon gas whose dew point is lower than or equal to −70° C., more preferably lower than or equal to −100° C.

As a light-reflecting material that can be used for the electrode provided on the side opposite to the electrode to which light is emitted, any of the following materials can be used: a metal material such as aluminum, gold, platinum, silver, nickel, tungsten, chromium, molybdenum, iron, cobalt, copper, and palladium; or an alloy material containing any of these metal materials. Alternatively, lanthanum, neodymium, germanium, or the like may be added to any of the above the metal materials or the alloy materials. Examples of the alloy material are alloys containing aluminum (aluminum alloys) such as an alloy of aluminum and titanium, an alloy of aluminum and nickel, and an alloy of aluminum and neodymium; and alloys containing silver such as an alloy of silver and copper and an alloy of silver and magnesium. An alloy of silver and copper is preferable because of its high heat resistance. Further, by stacking a metal film or a metal oxide film in contact with an aluminum alloy film, oxidation of the aluminum alloy film can be suppressed. Examples of a material for the metal film or the metal oxide film are titanium, titanium oxide, and the like. Alternatively, a stack of a film containing any of the above light-transmitting materials and a film containing any of the above metal materials may be used. For example, a layered film of silver and indium tin oxide, or a layered film of a silver-magnesium alloy and indium tin oxide can be used.

The insulating layer 217 is provided to cover the end portion of the pixel electrode 223. Moreover, an upper end portion or a lower end portion of the insulating layer 217 preferably has a curved surface with a radius of curvature of 0.2 μm to 3 μm in order to be adequately covered with the common electrode 227 which is formed over the insulating layer 217. As a material of the insulating layer 217, an organic compound such as a negative photosensitive resin or a positive photosensitive resin, or an inorganic compound such as silicon oxide or silicon oxynitride can be used.

An insulating layer 215 is formed over a surface of the first substrate 111. The insulating layer 215 reduces diffusion of impurities included in the first substrate 111. The insulating layers 216 and 218, which are in contact with a semiconductor layer in the transistors, and the insulating layer 219, which covers the transistors, preferably reduce diffusion of impurities into the semiconductor included in the transistors. For these insulating layers, for example, a semiconductor such as silicon, an oxide or a nitride of a metal such as aluminum can be used. Alternatively, a stack of such an inorganic insulating material or a stack of such an inorganic insulating material and an organic insulating material may be used. Note that the insulating layer 215 is not necessarily provided when not needed.

The second substrate 112 is provided with a color filter 229 so that the color filter 229 overlaps with the light-emitting element 220. The color filter 229 is provided in order to adjust the color of light emitted from the light-emitting element 220. For example, in a full-color display device using white light-emitting elements, a plurality of pixels provided with color filters of different colors are used. In that case, the color filters may be those of three colors of R (red), G (green), and B (blue) or four colors (yellow (Y) in addition to these three colors). Further, a white (W) pixel may be added to R, G and B pixels (and a Y pixel). That is, color filters of four colors (or five colors) may be used.

Further, a black matrix 231 is provided between adjacent color filters 229. The black matrix 231 blocks a pixel from light emitted from the light-emitting element 220 in an adjacent pixel, thereby preventing color mixture between the adjacent pixels. The color filter 229 is provided so that its end portion overlaps with the black matrix 231, whereby light leakage can be reduced. The black matrix 231 can be formed using a material that blocks light emitted from the light-emitting element 220, for example, a metal or an organic resin including a pigment. Note that the black matrix 231 may be provided in a region other than the display portion 201, for example, in the scan line driver circuit 202.

In addition, an overcoat 233 is formed to cover the color filter 229 and the black matrix 231. The overcoat 233 is formed using a material that transmits light emitted from the light-emitting element 220, and can be an inorganic insulating film or an organic insulating film, for example. Note that the overcoat 233 is not necessarily provided when not needed.

Although only one light-emitting element 220 is illustrated in the cross-sectional view in FIG. 11B illustrates, light-emitting elements that emit light of three colors (R, and B) can be selectively formed in the pixel portion 201 to form a display device capable of full color display. Alternatively, a light-emitting element including a white light-emitting EL layer described in a later embodiment and a color filter can be combined to form a display device capable of full color display. The light-emitting element is not limited to having a top-emission structure, and can have any of a bottom-emission structure and a dual-emission structure. A structural example of a light-emitting device having a bottom-emission structure will be described in Structural example 2.

The first substrate 111 and the second substrate 112 are bonded to each other with the glass layer 113 at a peripheral portion of the second substrate 112. The glass layer 113 can have any of the structures described in the above embodiment.

The light-emitting element 220 is provided in the sealed region surrounded by the first substrate 111, the second substrate 112, and the glass layer 113. The sealed region may be filled with an inert gas such as a rare gas or a nitrogen gas, a solid such as organic resin, or a viscous material such as a gel, or may contain a reduced pressure atmosphere. Impurities such as water or oxygen are preferably reduced in the sealed region so that the reliability of the light-emitting element 220 is increased.

Moreover, an insulating film covering the light-emitting element 220 prevents exposure of the light-emitting element 220, which increases reliability. As the insulating film, a material which does not transmit impurities such as moisture or oxygen is used. For example, an inorganic insulating film such as a film of an oxide or a nitride of silicon or aluminum can be used.

Further, a drying agent may be provided in a region which is not overlapped with the light-emitting element 220 in the sealed region. As the drying agent, for example, a substance which absorbs moisture by chemical adsorption, such as an oxide of an alkaline earth metal (e.g., calcium oxide or barium oxide), can be used. Alternatively, a substance which adsorbs moisture by physical adsorption, such as zeolite or silica gel, may be used as the drying agent. The drying agent is preferably provided in the sealed region, in which case impurities such as moisture can be reduced and the reliability of the light-emitting element 220 can be increased.

The foregoing has described the display device 200.

Structural Example 2

In this structural example, a display device having a bottom-emission structure will be described. Note that description of the portions described in Structural example 1 is omitted or is simply given.

Figure 12:
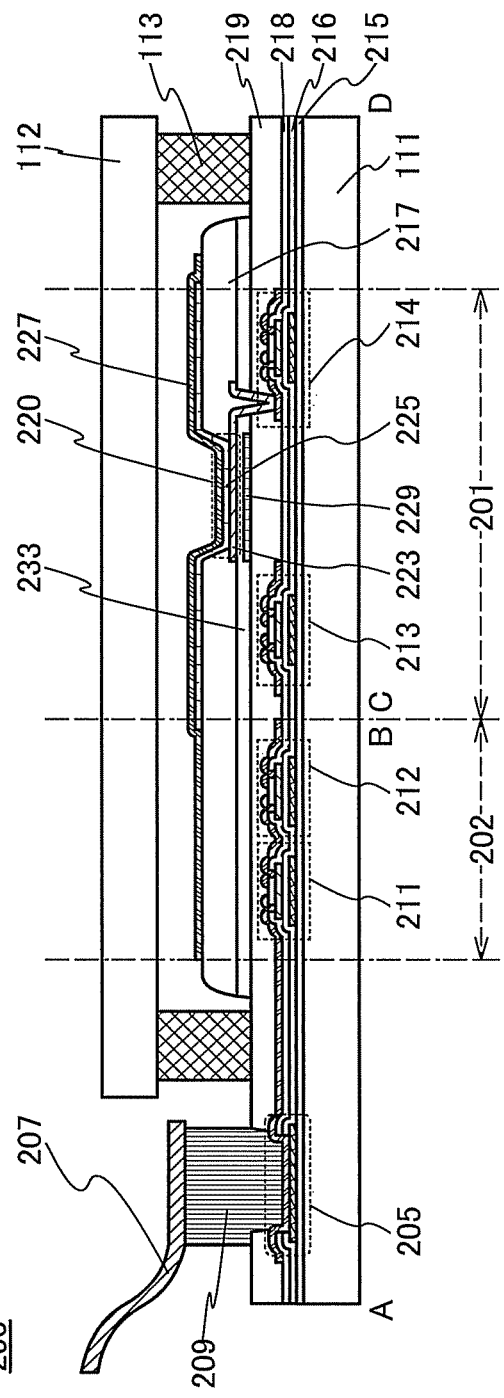
FIG. 12 illustrates a display device in accordance with one embodiment of the present invention.

FIG. 12 is a schematic cross-sectional view of a display device 250 described in this structural example.

The display device 250 is different from the display device 200 described in Structural example 1 in that the display device 250 has a bottom-emission structure and, in the display device 250, a color filter 229 is provided closer to the first substrate 111 than the light-emitting element 220 is.

In the light-emitting element 220, the reflective material is used for the common electrode 227 and the light-transmitting material is used for the pixel electrode 223. Thus, light emission from the EL layer 225 is emitted to the first substrate 111.

Further, the color filter 229 is provided over the insulating layer 219 covering transistors to overlap with the light-emitting element 220. Moreover, the overcoat 233 is formed to cover the color filter 229. The pixel electrode 223 is formed over the overcoat 233. Here, the overcoat 233 is preferably formed using an organic insulating film such as an organic resin, in which case the overcoat 233 also functions as a planarization layer.

The foregoing has described the display device 250.

When the method of forming a glass pattern and the method of manufacturing a sealed structure in one embodiment in accordance with the present invention is applied to the display devices described in this embodiment, an extremely highly reliable display device in which few cracks are generated can be obtained.

This embodiment can be combined with any of the other embodiments described in this specification as appropriate.

Embodiment 3

In this embodiment, as an example of a light-emitting device to which the heating method and the method of manufacturing a sealed structure which are exemplified in the above embodiment can be applied, a lighting device to which an organic EL element is applied will be described with reference to FIGS. 13A and 13B. Note that description of the same portions as those in the above embodiments is omitted or is simplified.

Figure 13A:
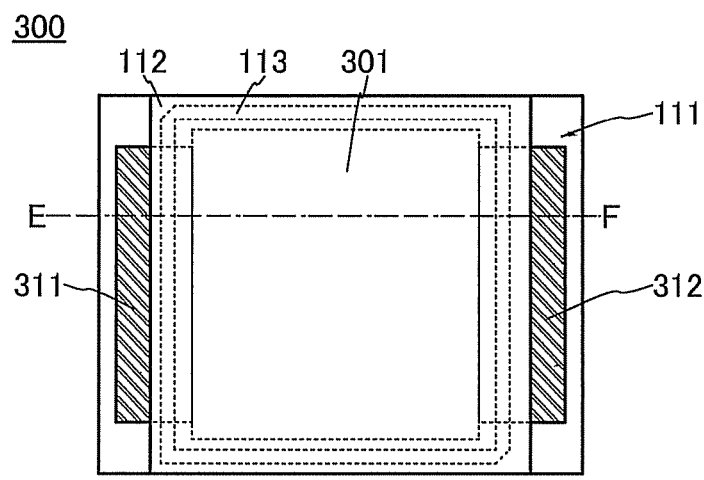
FIGS. 13A and 13B illustrate a lighting device in accordance with one embodiment of the present invention.

FIG. 13A is a schematic top view of a lighting device 300 described in this embodiment.

In the lighting device 300, a light-emitting portion 301 is included in the sealed region surrounded by the first substrate 111, the second substrate 112, and the glass layer 113. In addition, an extraction electrode 311 and an extraction electrode 312 which are electrically connected to the light-emitting portion 301 and supply electric power which causes the light-emitting portion 301 to emit light are provided to extend from the sealed region.

Figure 13B:
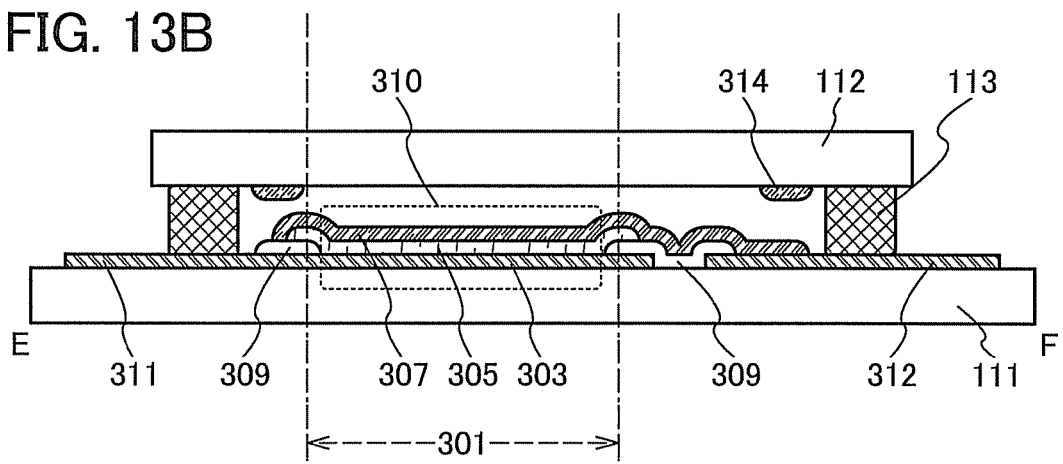

FIG. 13B is a schematic cross-sectional view along the line E-F, which cuts a region including the light-emitting portion 301, the extraction electrode 311, and the extraction electrode 312.

In the sealed region, a light-emitting element 310 including an electrode 303, an EL layer 305, and an electrode 307 is provided over the first substrate 111.

The first substrate 111 and the second substrate 112 are bonded to each other with the glass layer 113 at a peripheral portion of the second substrate 112. The glass layer 113 can have any of the structures described in the above embodiments.

The electrode 303 is electrically connected to the extraction electrode 311. Further, the electrode 307 is electrically connected to the extraction electrode 312. Here, FIG. 13B shows an example in which the electrode 303 and the extraction electrodes 311 and 312 are formed using the same layer on the same plane and part of the electrode 303 forms the extraction electrode 311.

An insulating layer 309 is provided to cover each of the ends of the electrode 303 and the extraction electrode 312. Further, the insulating layer 309 is provided in part of the region over the electrode 303 so as to prevent contact and conduction between the electrode 303 and the electrode 307.

The insulating layer 309 can have a structure similar to that of the insulating layer 217 exemplified in Embodiment 2

The electrode 307 is formed so as to extend beyond the insulating layer 309 which covers each of the ends of the electrode 303 and the extraction electrode 312, and electrically connected to the extraction electrode 312.

The lighting device 300 can have any of a bottom-emission structure, a top-emission structure, and a dual-emission structure. An electrically conductive material used for the electrodes 303 and 307 can be selected from the above materials as appropriate in accordance with the emission structure.

Further, an auxiliary electrode formed using a low-resistance electrically conductive material may be provided in order to increase the conductivity of the electrode 303 or the electrode 307. In particular, in the case of the lighting device 300 including a large-area light-emitting portion 301, a potential drop due to the resistance of the electrode may cause in-plane distribution of emission luminance and therefore providing the auxiliary electrode is effective.

For example, the auxiliary electrode is provided in contact with an upper surface or a bottom surface of the electrode 303. Alternatively, the auxiliary electrode which is electrically connected to the electrode 307 through an insulating layer is provided over the electrode 303. In the case where the auxiliary electrode which is in contact with the electrode 303 is provided, a step due to the auxiliary electrode is preferably covered with the insulating layer 309.

Further, as illustrated in FIG. 13B, a dry agent 314 is preferably provided in the sealed region. In the case of the top-emission structure or the dual-emission structure, the dry agent 314 is provided in a region which is not overlapped with the light-emitting element 310.

In addition, an insulating layer which suppresses diffusion of impurities from the substrate may be formed on a surface of the light-emitting element 310 side of one of or both the first substrate 111 and the second substrate 112.

Note that an inorganic insulating film which covers the light-emitting element 310 and does not transmit impurities such as water or oxygen may be provided. Moreover, the sealed region may be filled with an inert gas, a solid, or a viscous material, or may contain a reduced pressure atmosphere.

When the method of forming a glass pattern and the method of manufacturing a sealed structure in accordance with one embodiment of the present invention is applied to the lighting device exemplified in this embodiment, an extremely highly reliable lighting device in which few cracks are generated can be obtained.

This embodiment can be combined with any of the other embodiments described in this specification as appropriate.

Embodiment 4

In this embodiment, an example of the EL layer that can be applied to one embodiment of the present invention will be described with reference to FIGS. 14A to 14C.

Figure 14A:
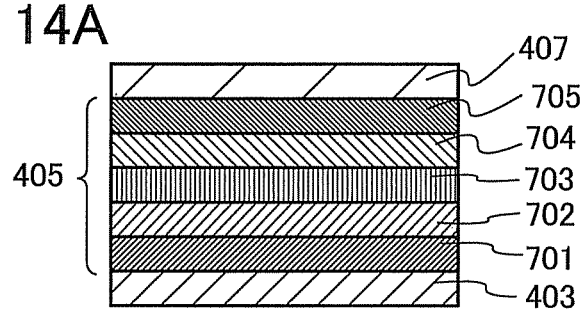
FIGS. 14A to 14C each illustrate a light-emitting element in accordance with one embodiment of the present invention.

An EL layer 405 illustrated in FIG. 14A is provided between a first electrode 403 and a second electrode 407. The first electrode 403 and the second electrode 407 can be have a structure similar to that of the pixel electrode or the common electrode exemplified in Embodiment 2, or the electrode exemplified in Embodiment 3.

A light-emitting element including the EL layer 405, which is exemplified in this embodiment, can be applied to any of the light-emitting devices exemplified in the above embodiments.

The EL layer 405 needs to include at least a light-emitting layer including a light-emitting organic compound. The EL layer 405 may have a stacked layer structure of a layer including a substance having a high electron-transport property, a layer including a substance having a high hole-transport property, a layer including a substance having a high electron-injection property, a layer including a substance having a high hole-injection property, a layer including a bipolar substance (a substance having a high electron-transport property and a high hole-transport property), and the like in appropriate combination. In the EL layer 405 of this embodiment, a hole-injection layer 701, a hole-transport layer 702, a layer 703 including a light-emitting organic compound, an electron-transport layer 704, and an electron-injection layer 705 are stacked in this order over the first electrode 403. Note that the stacking order of these layers may be reversed.

A method of manufacturing the light-emitting element illustrated in FIG. 14A will be described.

The hole-injection layer 701 is a layer including a substance having a high hole-injection property. As the substance having a high hole-injection property, for example, any of the following metal oxides can be used: molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide. A phthalocyanine-based compound such as phthalocyanine (abbreviation: $H_2Pc$), or copper(II) phthalocyanine (abbreviation: CuPc) can also be used.

Alternatively, an aromatic amine compound which is a low molecular organic compound or the like can be used.

Further alternatively, a high molecular compound (e.g., an oligomer, a dendrimer, or a polymer) can be used. A high molecular compound to which acid is added can also be used.

In particular, the hole-injection layer 701 is preferably formed with a composite material in which an acceptor substance is mixed with an organic compound having a high hole-transport property. The use of the composite material in which an acceptor substance is mixed with a substance having a high hole-transport property, allows efficient hole injection from the first electrode 403, and reduction in driving voltage of the light-emitting element. Such a composite material can be formed by co-evaporation of a substance having a high hole-transport property and an acceptor substance (an electron acceptor). By using the composite material for the hole-injection layer 701, holes can be easily injected from the first electrode 403 to the EL layer 405.

As the organic compound used for the composite material, any of a variety of compounds such as aromatic amine compounds, carbazole derivatives, aromatic hydrocarbons, and high molecular compounds (such as oligomers, dendrimers, and polymers) can be used. The organic compound used for the composite material is preferably an organic compound having a high hole-transport property. Specifically, a substance having a hole mobility of $10^{-6}$ cm$^2$/Vs or higher is preferably used. Note that any other substances may also be used as long as its hole-transport property is higher than its electron-transport property.

As the organic compound that can be used for the composite material, an aromatic amine compound, a carbazole derivative, an aromatic hydrocarbon compound having a high hole mobility can be used.

Examples of the acceptor substance are organic compounds and transition metal oxides. Any of oxides of metals belonging to Groups 4 to 8 in the periodic table can also be used. Specifically, it is preferable to use vanadium oxide, niobium oxide, tantalum oxide, chromium oxide, molybdenum oxide, tungsten oxide, manganese oxide, or rhenium oxide because of their high electron-accepting property. Among these metal oxides, molybdenum oxide is especially preferable because it is stable in the air, has a low hygroscopic property, and is easily treated.

A composite material may be formed using a high molecular compound and the aforementioned electron acceptor and used for the hole-injection layer 701.

The hole-transport layer 702 is a layer including a substance having a high hole-transport property. As the substance having a high hole-transport property, for example, any of aromatic amine compounds can be used. These substances are mainly ones that have a hole mobility of $10^{-6}$ cm$^2$/V·s or higher. Note that any other substances may also be used as long as its hole-transport property is higher than its electron-transport property. The layer including a substance having a high hole-transport property is not limited to a single layer, and two or more layers containing the aforementioned substances may be stacked.

A carbazole derivative, an anthracene derivative, or a high molecular compound having a high hole-transport property may also be used for the hole-transport layer 702.

For the layer 703 including a light-emitting organic compound, a fluorescent compound which exhibits fluorescence or a phosphorescent compound which exhibits phosphorescence can be used.

Note that the layer 703 including a light-emitting organic compound may have a structure in which a light-emitting organic compound (guest material) is dispersed in another substance (host material). Various kinds of materials can be used as the host material, and it is preferable to use a substance which has a lowest unoccupied molecular orbital level (LUMO level) higher than that of the light-emitting substance and has a highest occupied molecular orbital level (HOMO level) lower than that of the light-emitting substance.

Alternatively, two or more kinds of materials can be used as the host material. For example, a substance preventing crystallization may be added in order to prevent crystallization. A different kind of substance may be further added in order to efficiently transfer energy to the guest material. In addition, another substance may be added in order to efficiently transfer energy to the guest material.

When a structure in which a guest material is dispersed in a host material is employed, crystallization of the layer 703 including a light-emitting organic compound can be suppressed. Further, concentration quenching due to high concentration of the guest material can be suppressed.

For the layer 703 including a light-emitting organic compound, a high molecular compound can be used.

Further, when a plurality of layers each including a light-emitting organic compound is provided and the emission colors of the layers are made different, light emission of a desired color can be obtained from the light-emitting element as a whole. For example, in a light-emitting element including two layers each including a light-emitting organic compound, the emission color of a first layer including a light-emitting organic compound and the emission color of a second layer including a light-emitting organic compound are made complementary, so that the light-emitting element as a whole can emit white light. Note that "complementary colors" refer to colors that can produce an achromatic color when mixed. In other words, by mixing light obtained from substances which emit light of complementary colors, white light emission can be obtained. This can be applied to a light-emitting element including three or more layers each including a light-emitting organic compound.

The electron-transport layer 704 is a layer including a substance having a high electron-transport property. Examples of the substance having a high electron-transport property are mainly ones that have an electron mobility of $10^{-6}$ cm$^2$/Vs or higher. Furthermore, the electron-transport layer is not limited to a single layer and may be a stack of two or more layers including any of the above substances.

The electron-injection layer 705 is a layer including a substance having a high electron-injection property. For the electron-injection layer 705, an alkali metal, an alkaline-earth metal, or a compound thereof, such as lithium, cesium, calcium, lithium fluoride, cesium fluoride, calcium fluoride, or lithium oxide, can be used. A rare-earth metal compound such as erbium fluoride can also be used. Any of the above substances for forming the electron-transport layer 704 can also be used.

Note that the hole-injection layer 701, the hole-transport layer 702, the layer 703 containing a light-emitting organic compound, the electron-transport layer 704, and the electron-injection layer 705 which are described above can each be formed by a method such as an evaporation method (e.g., a vacuum evaporation method), an inkjet method, or a coating method.

Figure 14B:
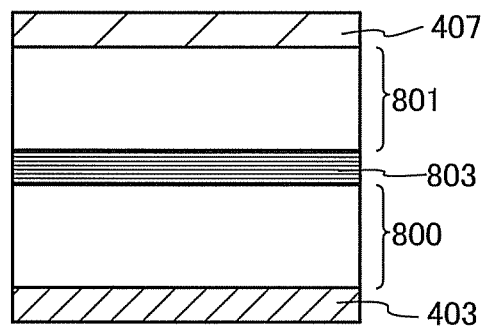

As illustrated in FIG. 14B, a plurality of EL layers may be stacked between the first electrode 403 and the second electrode 407. In that case, a charge generation layer 803 is preferably provided between a first EL layer 800 and a second EL layer 801 which are stacked. The charge generation layer 803 can be formed using the above-described composite material. Further, the charge generation layer 803 may have a stacked-layer structure including a layer including the composite material and a layer including another material. In that case, as the layer including another material, a layer including a substance having an electron-donating property (a donor substance) and a substance having a high electron-transport property, a layer formed of a transparent conductive film, or the like can be used. A light-emitting element having such a structure is unlikely to suffer the problem of energy transfer, quenching, or the like and gives wider choice of materials, thereby easily having both high light emission efficiency and a long lifetime. In addition, a light-emitting element which provides phosphorescence from one EL layer and fluorescence from another EL layer can be easily obtained. This structure can be combined with any of the above-mentioned EL layer structures.

Furthermore, different emission colors of the EL layers enable light emission of a desired color to be obtained from the light-emitting element as a whole. For example, the emission colors of first and second EL layers are complementary in a light-emitting element having the two EL layers, so that the light-emitting element can be made to emit white light as a whole. This can be applied to a light-emitting element having three or more EL layers.

In order to obtain white light with a high color rendering property, an emission spectrum needs to cover the whole visible light range and thus a light-emitting element preferably includes three or more EL layers stacked. For example, such a light-emitting element can be formed by stacking EL layers emitting light of the respective colors of red, blue, and green. In this manner, the color rendering property of a light-emitting element can be improved by stacking EL layers of different three or more colors.

An optical adjustment layer may be formed between the first electrode 403 and the second electrode 407. The optical adjustment layer adjusts the optical distance between a reflective electrode and a light-transmitting electrode. With the optical adjustment layer, light with wavelengths in a specific range can be enhanced so that the color tone can be adjusted.

Figure 14C:
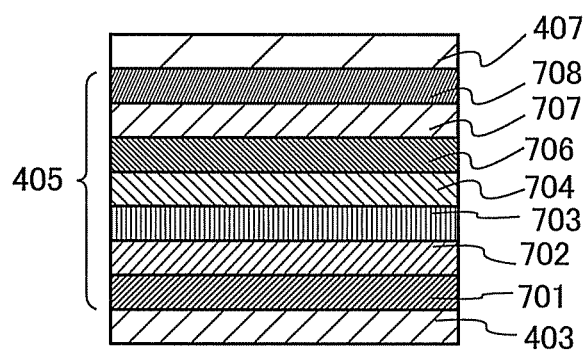

As illustrated in FIG. 14C, the EL layer 405 may include, between the first electrode 403 and the second electrode 407, the hole-injection layer 701, the hole-transport layer 702, the layer 703 including a light-emitting organic compound, the electron-transport layer 704, an electron-injection buffer layer 706, an electron-relay layer 707, and a composite material layer 708 that is in contact with the second electrode 407.

The composite material layer 708 which is in contact with the second electrode 407 is preferably provided, in which case damage caused to the EL layer 405 particularly when the second electrode 405 is formed by a sputtering method can be reduced. The composite material layer 708 can be formed using the above-described composite material in which an acceptor substance is mixed with an organic compound having a high hole-transport property.

With the electron-injection buffer layer 706, an injection barrier between the composite material layer 708 and the electron-transport layer 704 can be reduced, and accordingly electrons generated in the composite material layer 708 can be easily injected into the electron-transport layer 704.

For the electron-injection buffer layer 706, any of the following substances having a high electron-injection property is, used: alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)).

In addition, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can also be used other than any of alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)). Note that as the substance having a high electron-injection property, a material similar to the material for the electron transport layer 704 described above can be used.

The electron-relay layer 707 is preferably formed between the electron-injection buffer layer 706 and the composite material layer 708. The electron-relay layer 707 is not necessarily provided; however, with the electron-relay layer 707 having a high electron-transport property, electrons can be rapidly transported to the electron-injection buffer layer 706.

The structure in which the electron-relay layer 707 is provided between the composite material layer 708 and the electron-injection buffer layer 706 is a structure in which the acceptor substance included in the composite material layer 708 and the donor substance included in the electron-injection buffer layer 706 are less likely to interact with each other, and thus their functions hardly interfere with each other. Accordingly, an increase in the driving voltage can be prevented.

The electron-relay layer 707 contains a substance having a high electron-transport property and is formed so that the LUMO level of the substance having a high electron-transport property is located between the LUMO level of the acceptor substance included in the composite material layer 708 and the LUMO level of the substance having a high electron-transport property which is included in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property which is included in the electron-transport layer 704. As a specific value of the energy level, the LUMO level of the substance having a high electron-transport property which is included in the electron-relay layer 707 is preferably greater than or equal to −5.0 eV, more preferably greater than or equal to −5.0 eV and less than or equal to −3.0 eV.

As the substance having a high electron-transport property which is included in the electron-relay layer 707, a phthalocyanine-based material or a metal complex having a metal-oxygen bond and an aromatic ligand is preferably used.

As the metal complex having a metal-oxygen bond and an aromatic ligand, which is included in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having the metal-oxygen double bond makes it possible to drive a light-emitting element at low voltage more stably.

As a metal complex having a metal-oxygen bond and an aromatic ligand, a phthalocyanine-based material is preferable. A substance in which a metal-oxygen double bond is more likely to act on another molecular in terms of a molecular structure is particularly preferable because it has a high acceptor property.

Note that as the phthalocyanine-based materials described above, a phthalocyanine-based material having a phenoxy group is preferred. Specifically, a phthalocyanine derivative having a phenoxy group, such as PhO-VOPc, is preferred. A phthalocyanine derivative having a phenoxy group is soluble in a solvent. For that reason, such a phthalocyanine derivative has an advantage of being easily handled during formation of a light-emitting element. Further, owing to the solubility in a solvent, such a phthalocyanine derivative also has an advantage of facilitating maintenance of an apparatus used for foaming a film.

The electron-relay layer 707 may further contain a donor substance. As the donor substance, an organic compound such as tetrathianaphthacene (abbreviation: TTN), nickelocene, or decamethylnickelocene can be used other than any of alkali metals, alkaline-earth metals, rare-earth metals, compounds thereof (including alkali metal compounds (including oxides such as lithium oxide, halides, and carbonates such as lithium carbonate or cesium carbonate), alkaline-earth metal compounds (including oxides, halides, and carbonates), and rare-earth metal compounds (including oxides, halides, and carbonates)). When such a donor substance is included in the electron-relay layer 707, electrons can be transferred easily and the light-emitting element can be driven at lower voltage.

In the case where a donor substance is included in the electron-relay layer 707, in addition to the materials described above as the substance having a high electron-transport property, a substance having a LUMO level greater than the acceptor level of the acceptor substance included in the composite material layer 708 can be used. Specifically, it is preferable to use a substance having a LUMO level higher than or equal to −5.0 eV, preferably higher than or equal to −5.0 eV and lower than or equal to −3.0 eV. Examples of such a substance, a perylene derivative are nitrogen-containing condensed aromatic compounds and the like. Note that a nitrogen-containing condensed aromatic compound is preferably used for the electron-relay layer 707 because of its stability.

Note that in the case where a donor substance is included in the electron-relay layer 707, the electron-relay layer 707 may be formed by a method such as co-evaporation of the substance having a high electron-transport property and the donor substance.

The hole-injection layer 701, the hole-transport layer 702, the layer 703 containing a light-emitting organic compound, and the electron-transport layer 704 may be formed using the above-described materials.

In the above manner, the EL layer 405 of this embodiment can be manufactured.

This embodiment can be combined with any of the other embodiments described in this specification as appropriate.

Embodiment 5

In this embodiment, examples of an electronic device or a lighting device using an light-emitting device in accordance with one embodiment of the present invention will be described with reference to FIGS. 15A to 15E and FIGS. 16A to 16C.

Examples of the electronic device to which the light-emitting device is applied are television devices (also referred to as TV or television receivers), monitors for computers and the like, cameras such as digital cameras and digital video cameras, digital photo frames, mobile phone sets (also referred to as portable mobile phones or telephone devices), portable game machines, portable information terminals, audio playback devices, large game machines such as pachinko machines, and the like. Specific examples of the electronic device are illustrated in FIGS. 15A to 15E.

FIG. 15A illustrates an example of a television device. In a television device 7100, a display portion 7103 is incorporated in a housing 7101. Images can be displayed on the display portion 7103, and the light-emitting device can be used for the display portion 7103. Here, the housing 7101 is supported by a stand 7105.

The television device 7100 can be operated with an operation switch of the housing 7101 or a separate remote controller 7110. With operation keys 7109 of the remote controller 7110, channels and volume can be controlled and images displayed on the display portion 7103 can be controlled. The remote controller 7110 may have a display portion 7107 for displaying data output from the remote controller 7110.

Note that the television device 7100 is provided with a receiver, a modem, and the like. A general television broadcast can be received with the receiver. When the television device 7100 is connected to a communication network with or without wires via the modem, one-way (from a sender to a receiver) or two-way (between a sender and a receiver or between receivers) information communication can be performed.

FIG. 15B illustrates a computer that includes a main body 7201, a housing 7202, a display portion 7203, a keyboard 7204, an external connection port 7205, a pointing device 7206, and the like. This computer is manufactured using the light-emitting device for the display portion 7203.

FIG. 15C illustrates a portable game machine that includes two housings, a housing 7301 and a housing 7302, which are connected with a joint portion 7303 so that the portable game machine can be opened or folded. A display portion 7304 is incorporated in the housing 7301, and a display portion 7305 is incorporated in the housing 7302. The portable game machine in FIG. 15C also includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), and a microphone 7312), and the like. Needless to say, without limitation to the above structure, the portable game machine can include other accessories as appropriate as long as the light-emitting device is used for at least one of the display portions 7304 and 7305. The portable game machine in FIG. 15C has a function of reading a program or data stored in a recording medium to display it on the display portion, and a function of sharing information with another portable game machine by wireless communication. The portable game machine in FIG. 15C can have a variety of functions without limitation to the above functions.

FIG. 15D illustrates an example of a mobile phone. A mobile phone set 7400 includes a display portion 7402 incorporated in a housing 7401, an operation button 7403, an external connection port 7404, a speaker 7405, a microphone 7406, and the like. The mobile phone set 7400 is manufactured using the light-emitting device for the display portion 7402.

When the display portion 7402 is touched with a finger or the like, data can be input into the mobile phone set 7400 in FIG. 15D. Operations such as making a call and creating an e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a character input mode mainly for inputting a character is selected for the display portion 7402 so that a character displayed on a screen can be input. In this case, it is preferable to display a keyboard or number buttons on almost all the area of the screen of the display portion 7402.

When a detection device including a sensor for detecting inclination, such as a gyroscope or an acceleration sensor, is provided inside the mobile phone set 7400, display on the screen of the display portion 7402 can be automatically changed by determining the orientation of the mobile phone set 7400 (whether the mobile phone set is placed horizontally or vertically for a landscape mode or a portrait mode).

The screen modes are switched by touching the display portion 7402 or operating the operation button 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled to be switched from the input mode to the display mode.

The display portion 7402 may function as an image sensor. For example, an image of a palm print, a fingerprint, or the like is taken by touching the display portion 7402 with the palm or the finger, whereby personal authentication can be performed. Further, by providing a backlight or a sensing light source which emits a near-infrared light in the display portion, an image of a finger vein, a palm vein, or the like can also be taken.

FIG. 15E illustrates an example of the lighting device. In a lighting device 7500, light-emitting devices 7503a to 7503d of one embodiment of the present invention are incorporated in a housing 7501 as light sources. The lighting device 7500 can be attached to a ceiling, a wall, or the like.

Further, the lighting device includes a light-emitting panel that emits light of a pale color which has high brightness and causes less eyestrain even after long-time use, light of a bright red color, and light of a bright color different from these colors. By adjustment of conditions under which light-emitting elements are driven for each emission color, a lighting device whose hue can be adjusted by a user can be achieved.

Figure 16A:
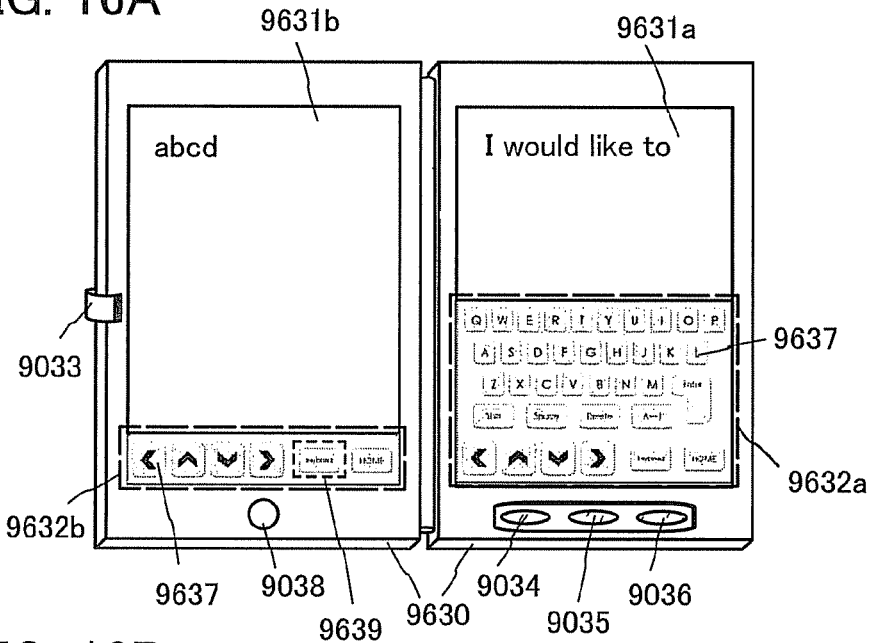
FIGS. 16A to 16C illustrate an electronic device in accordance with one embodiment of the present invention.
Figure 16B:
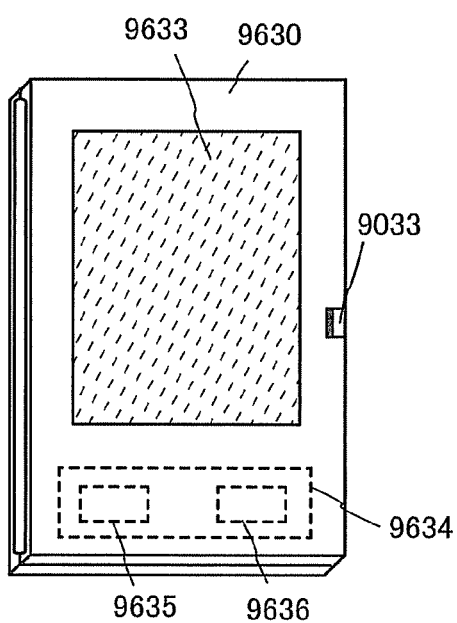

FIGS. 16A and 16B illustrate a tablet terminal that can be folded. In FIG. 16A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038. The tablet terminal is manufactured using the light-emitting device for one or both of the display portion 9631a and the display portion 9631b.

A touch panel area 9632a can be provided in a part of the display portion 9631a, in which area, data can be input by touching displayed operation keys 9637. Note that half of the display portion 9631a has only a display function and the other half has a touch panel function. However, one embodiment of the present invention is not limited to this structure, and the whole display portion 9631a may have a touch panel function. For example, a keyboard can be displayed on the whole display portion 9631a to be used as a touch panel, and the display portion 9631b can be used as a display screen.

A touch panel area 9632b can be provided in part of the display portion 9631b like in the display portion 9631a. When a keyboard display switching button 9639 displayed on the touch panel is touched with a finger, a stylus, or the like, a keyboard can be displayed on the display portion 9631b.

The touch panel area 9632a and the touch panel area 9632b can be controlled by touch input at the same time.

The display-mode switching button 9034 allows switching between a landscape mode and a portrait mode, between color display and black-and-white display, and the like. With the power-saving-mode switching button 9036, the display luminance can be optimized in accordance with the amount of external light in use which is detected by an optical sensor incorporated in the tablet terminal. In addition to the optical sensor, other detecting devices such as sensors for detecting inclination, like a gyroscope or an acceleration sensor, may be incorporated in the tablet terminal.

Although the display portion 9631a and the display portion 9631b have the same display area in FIG. 16A, one embodiment of the present invention is not limited to this example. The display portion 9631a and the display portion 9631b may have different areas or different display quality. For example, one display panel may be capable of higher-definition display than the other display panel.

FIG. 16B illustrates the tablet terminal folded, which includes the housing 9630, a solar battery 9633, a charge and discharge control circuit 9634, a battery 9635, and a DCDC converter 9636. Note that in FIG. 16B, an example in which the charge and discharge control circuit 9634 includes the battery 9635 and the DCDC converter 9636 is illustrated.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 16A and 16B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that a structure in which the solar battery 9633 is provided on one or both surfaces of the housing 9630 is preferable because the battery 9635 can be charged efficiently. The use of a lithium ion battery as the battery 9635 is advantageous in downsizing or the like.

Figure 16C:
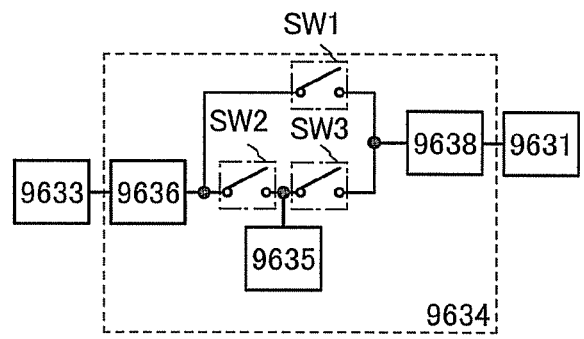
Figure 17A:
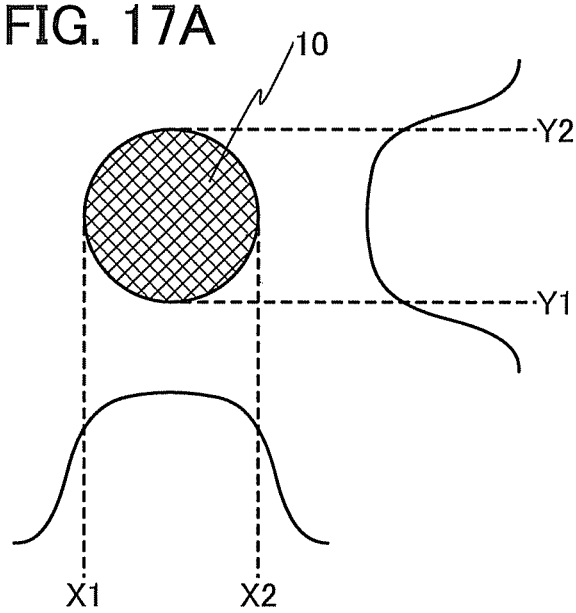
FIGS. 17A and 17B illustrate a circular laser beam in accordance with a conventional example.
Figure 17B:
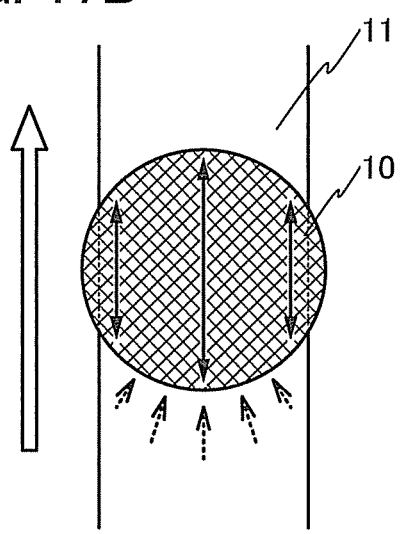

The structure and operation of the charge and discharge control circuit 9634 illustrated in FIG. 16B are described with reference to a block diagram of FIG. 16C. FIG. 16C illustrates the solar battery 9633, the battery 9635, the DCDC converter 9636, a converter 9638, switches SW1 to SW3, and the display portion 9631. The battery 9635, the DCDC converter 9636, the converter 9638, and the switches SW1 to SW3 correspond to the charge and discharge control circuit 9634 in FIG. 16B.

First, an example of the operation in the case where power is generated by the solar battery 9633 using external light is described. The voltage of power generated by the solar battery is raised or lowered by the DCDC converter 9636 so that a voltage for charging the battery 9635 can be obtained. When the display portion 9631 is operated with the power from the solar battery 9633, the switch SW1 is turned on and the voltage of the power is raised or lowered by the converter 9638 to a voltage needed for operating the display portion 9631. When display is not performed on the display portion 9631, the switch SW1 is turned off and the switch SW2 is turned on so that the battery 9635 can be charged.

Although the solar battery 9633 is illustrated as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

It is needless to say that one embodiment of the present invention is not limited to the electronic devices illustrated in FIGS. 15A to 15E and FIGS. 16A to 16C as long as any of the light-emitting devices described in the above embodiment is included.

The method of forming a glass pattern and the method of manufacturing a sealed structure in accordance with one embodiment of the present invention is applied to the light-emitting devices of the above-described electronic devices and lighting devices and the like. Therefore, an extremely highly reliable light-emitting device such as an electronic device or a lighting device in which few cracks are generated can be obtained.

This embodiment can be combined with any of the other embodiments described in this specification as appropriate.

This application is based on Japanese Patent Application serial no. 2011-232096 filed with the Japan Patent Office on Oct. 21, 2011, the entire contents of which are hereby incorporated by reference.

What is claimed is:

1. A method of heating a dispersion composition, comprising the step of scanning a beam spot of a laser beam while irradiating a composition having a linear closed curve shape and comprising a dispersoid and a disperse medium having a lower boiling point or a lower decomposition temperature than the dispersoid, with the laser beam,
wherein a shape of the beam spot is a rectangle,
wherein the scanning is performed while a minor axis of the beam spot is tilted relative to the scanning direction,
wherein the scanning with the tilted laser beam is performed along the closed curve shape, and
wherein the beam spot is scanned while each of two opposite sides of the beam spot intersects with opposite edges of the composition.

2. The method of heating a dispersion composition, according to claim 1, wherein the dispersion composition is a frit paste comprising glass frits and a binder.

3. The method of heating a dispersion composition, according to claim 1, wherein a major axis of the beam spot is 1.3 or more times as long as the minor axis of the beam spot.

4. The method of heating a dispersion composition, according to claim 1, wherein the scanning is performed while an angle formed between the minor axis and each of the sides of the dispersion composition is kept at 45°.

5. A method of heating a dispersion composition, comprising the step of scanning a beam spot of a laser beam while irradiating a composition having a closed curve shape and comprising a dispersoid and a disperse medium having a lower boiling point or a lower decomposition temperature than the dispersoid, with the laser beam,
wherein a shape of the beam spot is a rectangle having rounded corners,
wherein the scanning is performed while a minor axis of the beam spot is tilted relative to the scanning direction,
wherein the scanning with the tilted laser beam is performed along the closed curve shape, and
wherein the beam spot is scanned while each of two opposite sides of the beam spot intersects with opposite edges of the composition.

6. The method of heating a dispersion composition, according to claim 5, wherein the dispersion composition is a frit paste comprising glass frits and a binder.

7. The method of heating a dispersion composition, according to claim 5, wherein a major axis of the beam spot is 1.3 or more times as long as the minor axis of the beam spot.

8. The method of heating a dispersion composition, according to claim 5, wherein the scanning is performed while an angle formed between the minor axis and each of the sides of the dispersion composition is kept at 45°.

* * * * *

UNITED STATES PATENT AND TRADEMARK OFFICE
CERTIFICATE OF CORRECTION

| | | |
|---|---|---|
| PATENT NO. | : 8,623,469 B2 | |
| APPLICATION NO. | : 13/656059 | |
| DATED | : January 7, 2014 | |
| INVENTOR(S) | : Shimomura | |

It is certified that error appears in the above-identified patent and that said Letters Patent is hereby corrected as shown below:

In the Specification:

Column 1, Line 18; delete "fits" and insert --frits--.

Column 1, Line 22; delete "fits" and insert --frits--.

Column 1, Line 42; delete "no, backlight" and insert --no backlight--.

Column 1, Line 56; delete "fits" and insert --frits--.

Column 2, Line 67; delete "fits," and insert --frits--.

Column 3, Line 26; delete "fit" and insert --frit--.

Column 5, Line 49; delete "fits" and insert --frits--.

Column 5, Line 51; delete "filmed." and insert --formed.--.

Column 9, Line 13; delete "fit" and insert --frit--.

Column 9, Line 39; delete "Ruining" and insert --forming--.

Column 9, Line 54; delete "fits" and insert --frits--.

Column 12, Line 2; delete "fits" and insert --frits--.

Column 13, Line 66; delete "fit" and insert --frit--.

Column 14, Line 15; delete "funned" and insert --formed--.

Column 14, Line 67; delete "fit" and insert --frit--.

Column 16, Line 4; delete "fainted" and insert --formed--.

Column 21, Line 9; delete "(R, and B)" and insert --(R, G, and B)--.

Column 27, Line 23; delete "is, used:" and insert --is used:--.

Column 28, Line 46; delete "foaming" and insert --forming--.

Signed and Sealed this
Tenth Day of June, 2014

Michelle K. Lee
*Deputy Director of the United States Patent and Trademark Office*